United States Patent
Gu et al.

(10) Patent No.: US 12,073,763 B2
(45) Date of Patent: Aug. 27, 2024

(54) PIXEL UNIT, DISPLAY SUBSTRATE AND DRIVING METHOD THEREOF, AND DISPLAY APPARATUS

(71) Applicants: BOE MLED Technology Co., Ltd., Beijing (CN); BOE TECHNOLOGY GROUP CO., LTD., Beijing (CN)

(72) Inventors: Qibing Gu, Beijing (CN); Guofeng Hu, Beijing (CN); Xiuling Li, Beijing (CN); Bao Fu, Beijing (CN); Wenchieh Huang, Beijing (CN); Lingyun Shi, Beijing (CN); Ming Chen, Beijing (CN)

(73) Assignees: BOE MLED TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/245,040

(22) PCT Filed: May 23, 2022

(86) PCT No.: PCT/CN2022/094523
§ 371 (c)(1),
(2) Date: Mar. 13, 2023

(87) PCT Pub. No.: WO2023/225810
PCT Pub. Date: Nov. 30, 2023

(65) Prior Publication Data
US 2024/0194113 A1 Jun. 13, 2024

(51) Int. Cl.
*G09G 3/20* (2006.01)
*G09G 3/32* (2016.01)
(Continued)

(52) U.S. Cl.
CPC ............ *G09G 3/2092* (2013.01); *G09G 3/32* (2013.01); *H01L 25/167* (2013.01);
(Continued)

(58) Field of Classification Search
CPC ................... G09G 3/2092; G09G 3/32; G09G 2300/0408; G09G 2310/08;
(Continued)

(56) References Cited

U.S. PATENT DOCUMENTS 9,153,171 B2 * 10/2015 Sakariya ............... H01L 25/167
9,626,908 B2 * 4/2017 Sakariya .............. G09G 3/3426
(Continued)

FOREIGN PATENT DOCUMENTS

| CN | 111243496 A | 6/2020 |
|---|---|---|
| CN | 112750397 A | 5/2021 |

(Continued)

*Primary Examiner* — Michael J Jansen, II
(74) *Attorney, Agent, or Firm* — IP & T GROUP LLP

(57) ABSTRACT

A pixel unit includes N light-emitting devices and a pixel driving chip. The pixel driving chip includes: a data signal terminal used to receive a data signal; a power supply signal terminal used to receive a power supply signal; and N signal channel terminals being in one-to-one correspondence with the N light-emitting devices. A first electrode of a first light-emitting device in the N light-emitting devices is configured to be coupled to the power supply signal terminal, a second electrode of an n-th light-emitting device in the N light-emitting devices is coupled to a first electrode of an (n+1)-th light-emitting device and an n-th signal channel terminal in the N signal channel terminals; N is a positive integer greater than 1, and n is a positive integer greater than or equal to 1 and less than or equal to N.

20 Claims, 10 Drawing Sheets

(51) Int. Cl.
 *H01L 25/16* (2023.01)
 *H01L 27/12* (2006.01)
(52) U.S. Cl.
 CPC ... *H01L 27/124* (2013.01); *G09G 2300/0408* (2013.01); *G09G 2310/08* (2013.01); *G09G 2320/064* (2013.01); *G09G 2330/021* (2013.01)
(58) Field of Classification Search
 CPC ........ G09G 2320/064; G09G 2330/021; H01L 25/167; H01L 27/124
 See application file for complete search history.

(56) References Cited

U.S. PATENT DOCUMENTS

| | | | |
|---|---|---|---|
| 10,066,819 B2* | 9/2018 | Cok | H05B 45/10 |
| 10,395,589 B1* | 8/2019 | Vahid Far | G09G 3/3208 |
| 10,395,590 B1* | 8/2019 | Lin | G09G 3/3275 |
| 10,395,594 B1* | 8/2019 | Charisoulis | G09G 3/3241 |
| 10,451,257 B2* | 10/2019 | Cok | F21V 19/0025 |
| 10,643,553 B2* | 5/2020 | Gu | G09G 3/3426 |
| 10,650,737 B2* | 5/2020 | Vahid Far | G09G 3/2014 |
| 10,714,001 B2* | 7/2020 | Cok | H10K 59/131 |
| 11,263,963 B2* | 3/2022 | Shaeffer | H05B 45/20 |
| 11,645,976 B2* | 5/2023 | Shaeffer | G09G 3/32 345/76 |
| 2015/0332635 A1* | 11/2015 | Lau | G09G 3/32 345/83 |
| 2016/0210895 A1* | 7/2016 | Fan | G09G 3/20 |
| 2017/0167703 A1* | 6/2017 | Cok | H05B 45/10 |
| 2017/0187976 A1* | 6/2017 | Cok | H04N 25/74 |
| 2017/0206845 A1* | 7/2017 | Sakariya | G09G 3/3266 |
| 2018/0182279 A1* | 6/2018 | Sakariya | G09G 3/2088 |
| 2018/0247586 A1* | 8/2018 | Vahid Far | G09G 3/3216 |
| 2018/0340681 A1* | 11/2018 | Cok | H05B 45/10 |
| 2019/0206330 A1* | 7/2019 | Kim | G09G 3/3283 |
| 2019/0347985 A1* | 11/2019 | Shaeffer | G09G 3/2003 |
| 2020/0033979 A1* | 1/2020 | Sauer | G06F 3/0412 |
| 2021/0256898 A1* | 8/2021 | Kim | G09G 3/2003 |
| 2021/0272510 A1* | 9/2021 | Huitema | G09G 3/3233 |
| 2022/0139316 A1* | 5/2022 | Liu | G09G 3/2014 345/214 |
| 2022/0208091 A1* | 6/2022 | Shaeffer | G09G 3/3216 |
| 2022/0223576 A1* | 7/2022 | Oh | H01L 25/162 |
| 2022/0276533 A1* | 9/2022 | Lee | G02F 1/133612 |
| 2022/0309997 A1 | 9/2022 | Hu et al. | |
| 2023/0267883 A1* | 8/2023 | Long | G09G 3/3233 345/205 |
| 2023/0316998 A1* | 10/2023 | Shaeffer | H05B 45/20 345/76 |

FOREIGN PATENT DOCUMENTS

| | | |
|---|---|---|
| CN | 113223443 A | 8/2021 |
| CN | 113223444 A | 8/2021 |
| CN | 113487997 A | 10/2021 |
| EP | 1647967 A1 | 4/2006 |
| JP | 2000089691 A | 3/2000 |

* cited by examiner

PIXEL UNIT, DISPLAY SUBSTRATE AND DRIVING METHOD THEREOF, AND DISPLAY APPARATUS

CROSS-REFERENCE TO RELATED APPLICATION

This application is a national phase entry under 35 USC 371 of International Patent Application No. PCT/CN2022/094523, filed on May 23, 2022, which is incorporated herein by reference in its entirety.

TECHNICAL FIELD

The present disclosure relates to the field of display technologies, and in particular, to a pixel unit, a display substrate and a driving method thereof, and a display apparatus.

BACKGROUND

Mini light-emitting diodes (Mini-LED), also known as "sub-millimeter light-emitting diodes", refer to LEDs with a grain size of about 100 microns or less, the Mini-LED has the grain size between a traditional light-emitting diode (LED) and a micro light-emitting diode (Micro-LED). For simplicity, the Mini-LED is an improved LED on the basis of traditional LED backlight.

SUMMARY

In an aspect, a pixel unit is provided. The pixel unit includes N light-emitting devices and a pixel driving chip. The pixel driving chip includes: a data signal terminal, a power supply signal terminal and N signal channel terminals. The data signal terminal is used to receive a data signal, the power supply signal terminal is used to receive a power supply signal, and N signal channel terminals are in one-to-one correspondence with the N light-emitting devices. A first electrode of a first light-emitting device in the N light-emitting devices is configured to be coupled to the power supply signal terminal, a second electrode of an n-th light-emitting device in the N light-emitting devices is coupled to a first electrode of an (n+1)-th light-emitting device and an n-th signal channel terminal in the N signal channel terminals; N is a positive integer greater than 1, and n is a positive integer greater than or equal to 1 and less than or equal to N.

In some embodiments, the pixel driving chip further includes a light-emitting control circuit coupled to the N signal channel terminals, the power supply signal terminal, and the data signal terminal, and the light-emitting control circuit is configured to control a magnitude of a current transmitted to the N light-emitting devices and a light-emitting duration of each light-emitting device according to luminance information of the N light-emitting devices, so as to control actual light-emitting luminance of each light-emitting device.

In some embodiments, the light-emitting control circuit includes a modulation circuit and a constant current source circuit, a terminal of the modulation circuit is coupled to the power supply signal terminal, and another terminal of the modulation circuit is coupled to the constant current source circuit.

In some embodiments, the modulation circuit includes N modulation sub-circuits that are in one-to-one correspondence with the N signal channel terminals; each modulation sub-circuit in the N modulation sub-circuits includes a control terminal, a first terminal and a second terminal; a first terminal of a first modulation sub-circuit in the N modulation sub-circuits is coupled to the power supply signal terminal, and a second terminal of an n-th modulation sub-circuit in the N modulation sub-circuits is coupled to a first terminal of an (n+1)-th modulation sub-circuit in the N modulation sub-circuits and the n-th signal channel terminal in the N signal channel terminals.

In some embodiments, the pixel driving chip further includes: a control signal terminal, a reference signal terminal, and a voltage signal terminal. The control signal terminal is used to receive a control signal, the reference signal terminal is used to receive a reference signal, and the voltage signal terminal is used receive a first voltage signal. The constant current source circuit of the light-emitting control circuit is further coupled to the reference signal terminal and the voltage signal terminal.

In some embodiments, the pixel driving chip further includes: a main processor coupled to the light-emitting control circuit, the voltage signal terminal, the control signal terminal and the data signal terminal. The main processor is configured to generate a current control signal and a plurality of pulse width modulation signals according to the luminance information of the N light-emitting devices included in the data signal, and transmit the current control signal to the constant current source circuit and transmit the plurality of pulse width modulation signals to the N modulation sub-circuits in a one-to-one correspondence manner.

In some embodiments, the main processor includes a processor and a control circuit. The processor is coupled to the N modulation sub-circuits, and the processor is configured to generate the plurality of pulse width modulation signals, and transmit the plurality of pulse width modulation signals to the N modulation sub-circuits in the one-to-one correspondence manner. The processor is further coupled to the control circuit, and the control circuit is coupled to the constant current source circuit; the processor is further configured to generate a first signal according to the luminance information, and transmit the first signal to the control circuit; the control circuit is configured to generate the current control signal according to the first signal, and transmit the current control signal to the constant current source circuit.

In some embodiments, the main processor further includes an interface circuit, the interface circuit is coupled to the data signal terminal, the voltage signal terminal and the processor; the interface circuit is configured to generate a decoded signal required by the processor according to the data signal at the data signal terminal and an identification signal transmitted at the voltage signal terminal, and transmit the decoded signal to the processor.

In some embodiments, the modulation sub-circuit includes a switching component.

In some embodiments, the N light-emitting devices include: a red light-emitting device, a green light-emitting device and a blue light-emitting device.

In another aspect, a display substrate is provided. The display substrate includes: a substrate, a plurality of pixel units, a plurality of power supply signal lines and a plurality of data signal lines. Each pixel unit in the plurality of pixel units is the pixel unit as described above, and the plurality of pixel units are disposed on a side of the substrate, and the plurality of pixel units are arranged in an array in a first direction and a second direction; the first direction and the second direction intersect each other. The plurality of power supply signal lines are disposed on the side of the substrate, and a power supply signal line in the plurality of power supply signal lines is coupled to power supply signal terminals of pixel driving chips of pixel units arranged in the second direction. The plurality of data signal lines are disposed on the side of the substrate, and a data signal line in the plurality of data signal lines is coupled to data signal terminals of the pixel driving chips of the pixel units arranged in the second direction.

In some embodiments, the pixel unit further includes: a control signal terminal, a reference signal terminal and a voltage signal terminal. The display substrate further includes: a plurality of control signal lines, a plurality of reference signal lines and a plurality of voltage signal lines. The plurality of control signal lines are disposed on the side of the substrate, and a control signal line in the plurality of control signal lines is coupled to control signal terminals of pixel driving chips of pixel units arranged in the first direction. The plurality of reference signal lines are disposed on the side of the substrate, and a reference signal line in the plurality of reference signal lines is coupled to reference signal terminals of pixel driving chips of the pixel units arranged in the second direction. The plurality of voltage signal lines are disposed on the side of the substrate, and a voltage signal line in the plurality of voltage signal lines is coupled to voltage signal terminals of the pixel driving chips of the pixel units arranged in the second direction.

In some embodiments, the plurality of control signal lines extend along the first direction and are arranged in the second direction, and the control signal line is located in a spacing between two adjacent lines of pixel units that are arranged in the second direction. The plurality of power supply signal lines, the plurality of data signal lines, the plurality of voltage signal lines and the plurality of reference signal lines extend along the second direction and are arranged in the first direction, and the power supply signal line, the data signal line, the voltage signal line and the reference signal line are located in a spacing between two adjacent lines of pixel units that are arranged in the first direction.

In some embodiments, the display substrate further includes a control chip, the control chip is connected to the plurality of data signal lines and the plurality of control signal lines, and the control chip is configured to provide the data signal to the data signal line and the control signal to the control signal line.

In yet another aspect, a driving method of a display substrate is provided. Each display frame of the display substrate includes a data signal setting phase and a display phase, a data signal includes a current signal and pulse width modulation signals, the display substrate includes a plurality of pixel units and a control chip, and each pixel unit in the plurality of pixel units includes N light-emitting devices.

The driving method includes: in the data signal setting phase: receiving, by the control chip, an image signal of an i-th frame, the image signal of the i-th frame including an initial current signal and an initial pulse width modulation signal that are corresponding to the N light-emitting devices of each pixel unit in the plurality of pixel units in a current frame of image, the initial current signal including N initial current sub-signals, and the initial pulse width modulation signal including N initial pulse width modulation sub-signals with a same number of bits; processing, by the control chip, the initial current signal to generate the current signal, the current signal including an initial current sub-signal with a largest current amplitude in the N initial current sub-signals; and processing, by the control chip, the initial pulse width modulation signal to generate the pulse width modulation signals, the pulse width modulation signals including N pulse width modulation sub-signals with different number of effective bits, i being a positive integer greater than or equal to 1, and N being a positive integer greater than 1;

in the display phase: emitting light by the N light-emitting devices of each pixel unit in the plurality of pixel units according to the current signal and the pulse width modulation signals.

In some embodiments, the display phase includes: an address assignment phase and a light-emitting phase, and the display substrate further includes a plurality of control signal lines and a plurality of data signal lines. In the address assignment phase, control information is sequentially input to each control signal line, and first data information is input to each data signal line; the first data information includes address information corresponding to pixel units arranged in a second direction. In the light-emitting phase, second data information is input to each data signal line; the second data information includes a plurality of pieces of data sub-information; a piece of data sub-information in the plurality of pieces of data sub-information includes: address information corresponding to each pixel unit, and the current signal and the pulse width modulation signals that are corresponding to the address information and corresponding to a pixel driving chip of a pixel unit coupled to the data signal line.

In some embodiments, the display substrate further includes a plurality of control signal lines and a plurality of data signal lines, and the display phase includes: inputting control information to an m-th control signal line, and inputting data information to each data signal line, the data information including the current signal and the pulse width modulation signals that are corresponding to a pixel driving chip of a pixel unit coupled to the data signal line. m is any positive integer from 1 to M, inclusive, and M is a number of all control signal lines arranged in the second direction. The control chip sequentially inputs control information to a first control signal line to an M-th control signal line.

In yet another aspect, a display apparatus is provided, and the display apparatus includes the display substrate described above.

In some embodiments, the display substrate further includes a control chip, the display apparatus further comprises a system circuit coupled to the control chip, and the system circuit is configured to provide an initial current signal and an initial pulse width modulation signal to the control chip.

In some embodiments, the pixel driving chip further includes a decoder coupled to the voltage signal terminal and the interface circuit, the decoder is configured to generate the identification signal according to the first voltage signal at the voltage signal terminal, and transmit the identification signal to the interface circuit.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
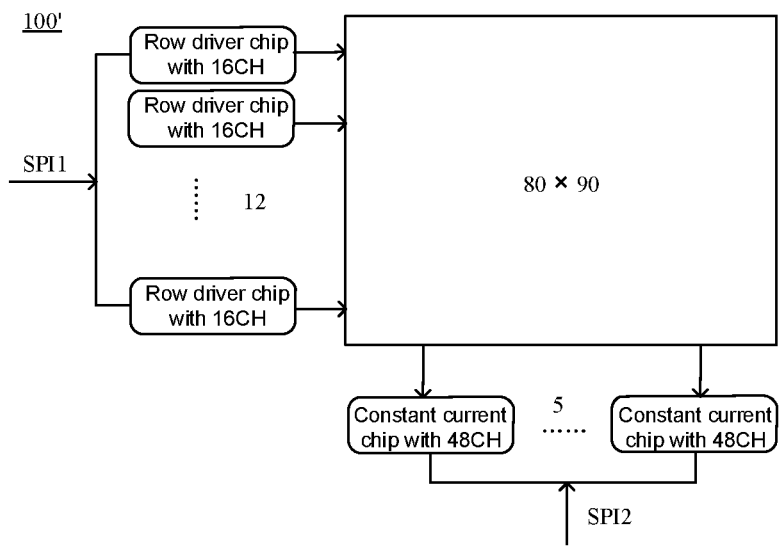
FIG. 1 is a structural diagram of a display panel, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" and "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the quantity of indicated technical features. Thus, a feature defined with "first" or "second" may explicitly or implicitly includes one or more of the features. In the description of the embodiments of the present disclosure, the terms "a plurality of", "the plurality of" and "multiple" each mean two or more unless otherwise specified.

In the description of some embodiments, the terms such as "coupled" and "connected" and their derivatives may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the context herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, depending on the context, the term "if" is optionally construed as "when", "in a case where", "in response to determining" or "in response to detecting". Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The phrase "applicable to" or "configured to" used herein means an open and inclusive expression, which does not exclude devices that are applicable to or configured to perform additional tasks or steps.

In addition, the phrase "based on" used is meant to be open and inclusive, since a process, step, calculation or other action that is "based on" one or more of the stated conditions or values may, in practice, be based on additional conditions or values exceeding those stated.

It will be understood that, in a case where a layer or component is referred to as being on another layer or substrate, it may be that the layer or component is directly on the another layer or substrate, or it may be that intermediate layer(s) exist between the layer or component and the another layer or substrate.

Mini light-emitting diodes (Mini-LEDs) were originally applied to backlight local dimming, and were driven in a passive matrix (PM) manner. With the development of the Mini-LEDs, the Mini-LEDs are gradually applied to display products, and Mini-LEDs in a Mini-LED display product are still driven in the PM manner.

The Mini-LEDs are applied to a printed circuit board (PCB) substrate, but the size of the LED cannot be made small. Therefore, the resolution of the Mini-LED display product based on the PCB substrate cannot be effectively improved. As a large number of Mini-LED products based on glass substrates are developed, the Mini-LEDs being driven in the PM manner is due to both the lack of the thickness of copper traces on the glass substrate and the limitation of the number of layers of the traces, and in this case, a multi-channel demultiplexer must be used to reduce the number of the traces. However, the multi-channel demultiplexer will cause a problem of excessive product power.

For example, as shown in FIG. 1, for a display panel 100' with a resolution of 80×90, each row control unit includes 12 row driver chips each having 16 channels (CH), and each column control unit includes 5 constant current chips each having 48CH. For example, each row driver chip may be connected to a peripheral circuit through a serial peripheral interface (SPI) to receive a corresponding signal, and each constant current chip may be connected to another peripheral circuit through an SPI to receive a corresponding signal. For example, 12 row driver chips are connected to the peripheral circuit through an SPI1, and 5 constant current chips are connected to the another peripheral circuits through an SPI2. As the resolution of the display panel 100' increases, the number of traces providing scan signals and data signals to the display panel 100' increases accordingly. Therefore, a large number of row control units and column control units are required, which will increase an area and layers of traces, and thus increase the cost of the display panel 100'. Moreover, the row control unit and the column control unit adopt a multi-channel demultiplexer solution, which results in currents transmitted on signal lines being large. As a result, an overall power consumption of the display panel will increase. In addition, a voltage drop of the trace also needs to be considered. In order to obtain a large-sized display panel, a tiled manner can only be used. For example, two 11.9-inch display panels are tiled to form an 18-inch display panel, so as to form a 36-inch display panel, 72-inch display panel or 144-inch display panel. In order to ensure seamless tile, it needs to adopt narrow-bezel and bezel-less designs on the display panel, which will greatly increase the complexity of the processes.

In conclusion, since the driving manner based on the row driver chips and the constant current chips is adopted, it requires a plurality of SPIs. In a case where a plurality of display panels are tiled and driven as a whole, more SPI signals are required, which puts greater driving pressure on the system. As a result, a multi-system solution is even required.

Figure 2:
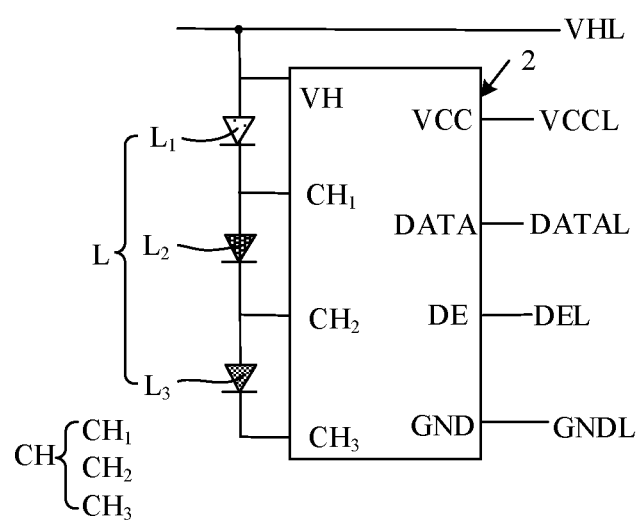
FIG. 2 is a structural diagram of a pixel unit, in accordance with some embodiments of the present disclosure.

In light of this, as shown in FIG. 2, some embodiments of the present disclosure provide a pixel unit 10. The pixel unit 10 includes N light-emitting devices L and a pixel driving chip 2. The pixel driving chip 2 includes: a data signal terminal DATA, a power supply signal terminal VH and N signal channel terminals CH. The data signal terminal DATA is used to receive a data signal, the power supply signal terminal VH is used to receive a power supply signal, and the N signal channel terminals CH are in one-to-one correspondence with the N light-emitting devices L. A first electrode of a first light-emitting device $L_1$ in the N light-emitting devices L is configured to be coupled to the power supply signal terminal VH, and a second electrode of an n-th light-emitting device $L_n$ in the N light-emitting devices L is coupled to a first electrode of an (n+1)-th light-emitting device $L_{n+1}$ and an n-th signal channel terminal $CH_n$ in the N signal channel terminals CH. N is a positive integer greater than 1, and n is a positive integer greater than or equal to 1 and less than or equal to N (i.e., N>1, and $1 \leq n \leq N$). That is, in the pixel unit 10 provided in the embodiments above, the N light-emitting devices L are sequentially connected end to end.

In some examples, with continued reference to FIG. 2, the pixel unit 10 includes three light-emitting devices L (i.e., N=3), and the three light-emitting devices L are the first light-emitting device $L_1$, a second light-emitting device $L_2$ and a third light-emitting device $L_3$. The first light-emitting device $L_1$ is configured to emit red light, the second light-emitting device $L_2$ is configured to emit green light, and the third light-emitting device $L_3$ is configured to emit blue light. The first electrode of the first light-emitting device $L_1$ is coupled to the power supply signal terminal VH to receive the power supply signal. A second electrode of the first light-emitting device $L_1$ is connected to a first electrode of the second light-emitting device $L_2$, and a second electrode of the second light-emitting device $L_2$ is connected to a first electrode of the third light-emitting device $L_3$. That is, the three light-emitting devices L are sequentially connected end to end.

The pixel driving chip 2 includes three signal channel terminals CH, and the three signal channel terminals are a first signal channel terminal $CH_1$, a second signal channel terminal $CH_2$ and a third signal channel terminal $CH_3$. The second electrode of the first light-emitting device $L_1$ is further connected to the first signal channel terminal $CH_1$, the second electrode of the second light-emitting device $L_2$ is further connected to the second signal channel terminal CH2, and a second electrode of the third light-emitting device $L_3$ is connected to the third signal channel terminal $CH_3$.

In some examples, the light-emitting device L is a Mini-LED or a Micro-LED.

In the embodiments of the present disclosure, N light-emitting devices L are sequentially connected end to end, and only the first light-emitting device $L_1$ is connected to the power supply signal terminal VH to receive the power supply signal, and the second electrode of each light-emitting device L is connected to a signal channel terminal CH. In this way, a structure of the pixel driving chip 2 may be simplified, so that an area occupied by the pixel driving chip is reduced. As a result, it is conducive to display of a high resolution and high pixels per inch (PPI).

Figure 3:
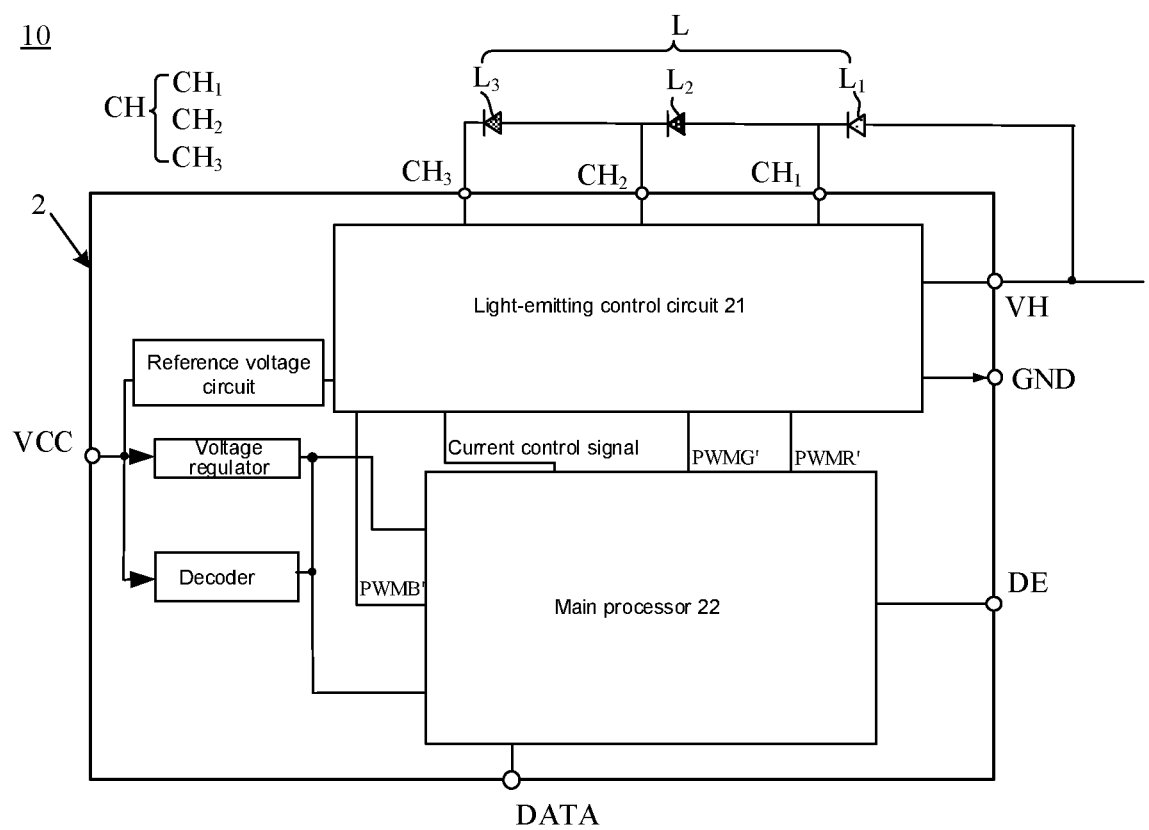
FIG. 3 is another structural diagram of a pixel unit, in accordance with some embodiments of the present disclosure.

In some embodiments, as shown in FIG. 3, the pixel driving chip 2 further includes a light-emitting control circuit 21. The light-emitting control circuit 21 is coupled to the N signal channel terminals CH, the power supply signal terminal VH and the data signal terminal DATA, and the light-emitting control circuit 21 is configured to control a magnitude of a current transmitted to the N light-emitting devices L and a light-emitting duration of each light-emitting device L according to luminance information of the N light-emitting devices L, so as to control actual light-emitting luminance of each light-emitting device L.

In some examples, with continued reference to FIG. 3, the light-emitting control circuit 21 is connected to three signal channel terminals CH, and the data signal received at the data signal terminal DATA of the pixel driving chip 2 includes the luminance information of the three light-emitting devices L. The light-emitting control circuit 21 of the pixel driving chip 2 controls the magnitude of the current flowing through the light-emitting devices L and the light-emitting duration of each light-emitting device L according to the luminance information, so as to control the actual light-emitting luminance of the three light-emitting devices L.

In the embodiments of the present disclosure, the pixel driving chip 2 may directly drive the N light-emitting devices L to emit light. In addition, a signal for controlling the magnitude of the current (which is also referred to as a current amplitude) transmitted to the N light-emitting devices L may be generated according to the luminance information. A light-emitting intensity of the light-emitting device L is positively correlated with the magnitude of the current. That is, the larger the current, the greater the light-emitting intensity of the light-emitting device L, the smaller the current, the less the light-emitting intensity of the light-emitting device L. A signal for controlling the light-emitting duration of each light-emitting device L may also be generated according to the luminance information. In a case where the current amplitude is certain, the actual light-emitting luminance of the light-emitting device L is positively correlated with the light-emitting duration of the light-emitting device L. That is, the longer the light-emitting duration of the light-emitting device L, the greater the actual light-emitting luminance of the light-emitting device L, the shorter the light-emitting duration of the light-emitting device L, the smaller the actual light-emitting luminance of the light-emitting device L. The light-emitting control circuit 21 generates both the signal for controlling the current amplitude of the light-emitting device L and the signal for controlling the light-emitting duration of the light-emitting device L according to the luminance information, so as to achieve a purpose of adjusting the actual light-emitting luminance of the N light-emitting devices L.

Figure 4:
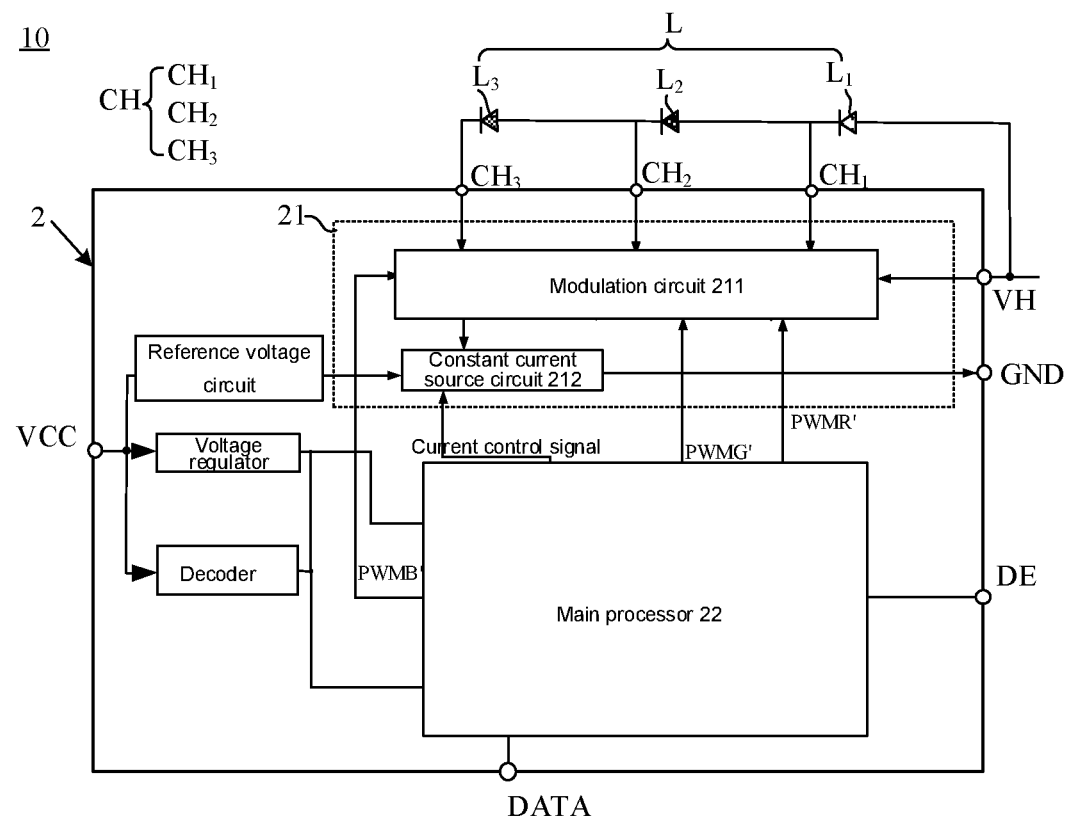
FIG. 4 is yet another structural diagram of a pixel unit, in accordance with some embodiments of the present disclosure.

In some embodiments, as shown in FIG. 4, the light-emitting control circuit 21 includes a modulation circuit 211 and a constant current source circuit 212. A terminal of the modulation circuit 211 is coupled to the power supply signal terminal VH, and another terminal of the modulation circuit 211 is coupled to the constant current source circuit 212.

For example, with continued reference to FIG. 4, the terminal of the modulation circuit 211 and the first electrode of the first light-emitting device $L_1$ are both connected to the power supply signal terminal VH to receive the power supply signal generated at the power supply signal terminal VH. The another terminal of the modulation circuit 211 is used to receive a current generated by the constant current source circuit 212.

The constant current source circuit 212 is a module occupying the largest area of the pixel driving chip 2, and the three light-emitting devices L are sequentially connected end to end. Therefore, the three light-emitting devices L may share one constant current source circuit 212, which effectively reduces the area of the pixel driving chip 2 and realizes a design of the pixel driving chip 2 having a smaller area.

Figure 5:
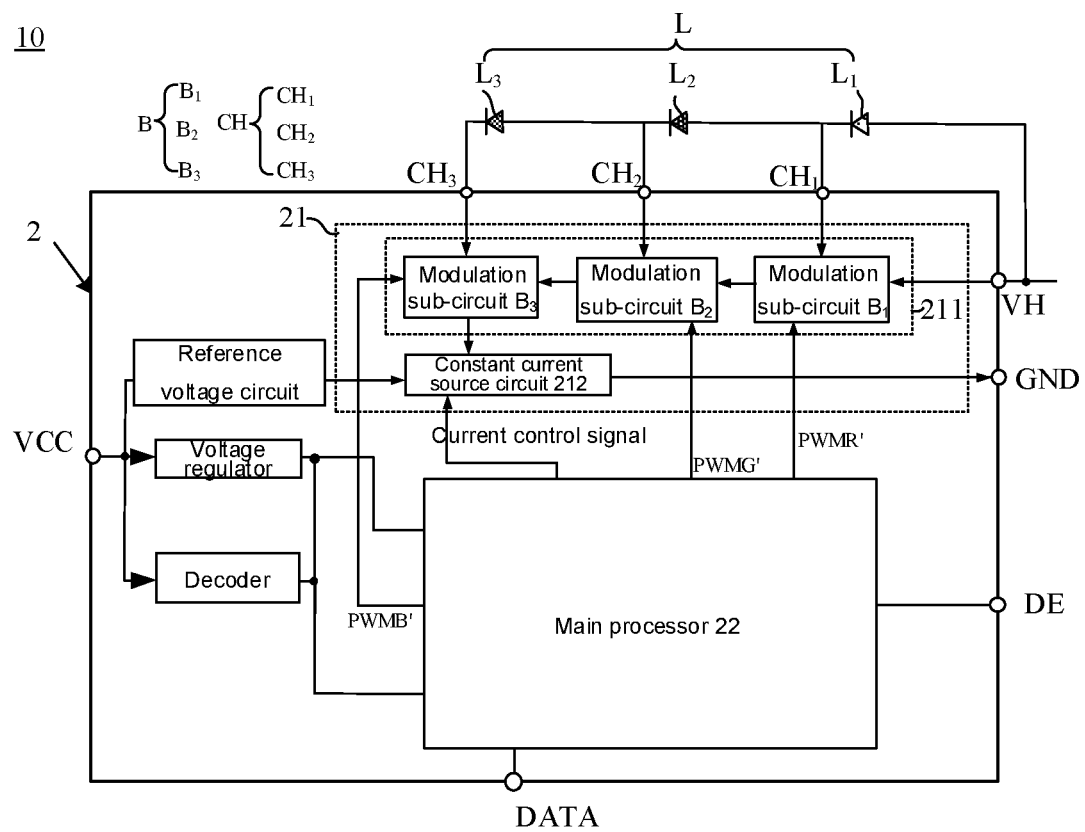
FIG. 5 is yet another structural diagram of a pixel unit, in accordance with some embodiments of the present disclosure.

In some embodiments, as shown in FIG. 5, the modulation circuit 211 includes N modulation sub-circuits B that are in one-to-one correspondence with the N signal channel terminals CH and are sequentially connected end to end. Each modulation sub-circuit B in the N modulation sub-circuits B includes a control terminal, a first terminal and a second terminal. A first terminal of a first modulation sub-circuit $B_1$ in the N modulation sub-circuits is coupled to the power supply signal terminal VH, and a second terminal of an n-th modulation sub-circuit $B_n$ in the N modulation sub-circuits is coupled to the first terminal of an (n+1)-th modulation sub-circuit $B_{n+1}$ in the N modulation sub-circuits and the n-th signal channel terminal $CH_n$ in the N signal channel terminals CH.

For example, with continued reference to FIG. 5, the modulation circuit 211 includes three modulation sub-circuits B that are in one-to-one correspondence with the three signal channel terminals CH. The three modulation sub-circuits B are the first modulation sub-circuit $B_1$, a second modulation sub-circuit $B_2$ and a third modulation sub-circuit $B_3$ that are sequentially connected end to end. The first terminal of the first modulation sub-circuit $B_1$ is connected to the power supply signal terminal VH, and a second terminal of the first modulation sub-circuit $B_1$ is connected to a first terminal of the second modulation sub-circuit $B_2$ and the first signal channel terminal $CH_1$. A second terminal of the second modulation sub-circuit $B_2$ is connected to a first terminal of the third modulation sub-circuit $B_3$ and the second signal channel terminal $CH_2$. A second terminal of the third modulation sub-circuit $B_3$ is connected to the constant current source circuit 212 and the third signal channel terminal $CH_3$.

That is, the n-th modulation sub-circuit $B_n$ is connected in parallel with the n-th light-emitting device $L_n$. Since the third modulation sub-circuit $B_3$ is connected to the constant current source circuit 212 and the third signal channel terminal $CH_3$, and the second electrode of the third light-emitting device $L_3$ is connected to the third signal channel terminal $CH_3$, the constant current source circuit 212 is connected to the second electrode of the third light-emitting device $L_3$. The constant current source circuit 212 is used to control a current on a loop where the light-emitting devices L are located.

For example, under control of a signal with a same current magnitude, the first light-emitting device $L_1$, the second light-emitting device $L_2$ and the third light-emitting device $L_3$ have different light-emitting durations under control of signals (pulse width modulation signals) that are generated by the modulation sub-circuits B and correspond to the first light-emitting device $L_1$, the second light-emitting device $L_2$ and the third light-emitting device $L_3$, so that the light-emitting devices L have different actual light-emitting luminance. For example, in a case where the first modulation sub-circuit $B_1$ is turned on, the first light-emitting device $L_1$ is short-circuited and does not emit light, in a case where the first modulation sub-circuit $B_1$ is turned off, the first light-emitting device $L_1$ can emit light. The duration where the first modulation sub-circuit $B_1$ is turned on or turned off is controlled by a signal, so that the light-emitting duration of the first light-emitting device $L_1$ is controlled. Under control of both the signal for controlling the magnitude of the current on each light-emitting device L and the signal for controlling the light-emitting duration of each light-emitting device L, the actual light-emitting luminance of the first light-emitting device $L_1$, the second light-emitting device $L_2$ and the third light-emitting device $L_3$ is adjusted.

The modulation sub-circuit B corresponding to each of the first light-emitting device $L_1$, the second light-emitting device $L_2$ and the third light-emitting device $L_3$ refers to a modulation sub-circuit B connected in parallel with the light-emitting device L. For example, the first light-emitting device $L_1$ corresponds to the first modulation sub-circuit $B_1$, the second light-emitting device $L_2$ corresponds to the second modulation sub-circuit $B_2$, and the third light-emitting device $L_3$ corresponds to the third modulation sub-circuit $B_3$.

Figure 6:
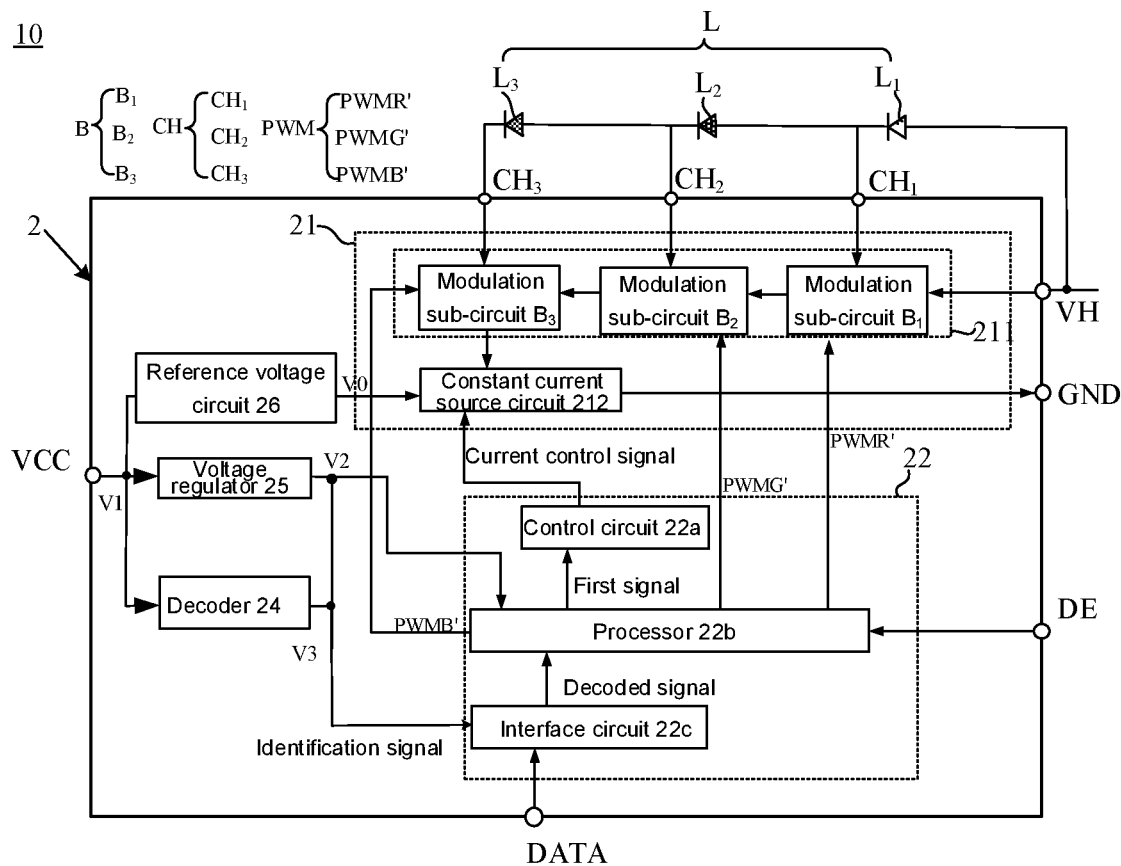
FIG. 6 is yet another structural diagram of a pixel unit, in accordance with some embodiments of the present disclosure.

In some embodiments, referring to FIG. 6, the pixel driving chip 2 further includes: a control signal terminal DE, a reference signal terminal GND and a voltage signal terminal VCC. The control signal terminal DE is used to receive a control signal, the reference signal terminal GND is used to receive a reference signal, and the voltage signal terminal VCC is used to receive a first voltage signal V1. The constant current source circuit 212 of the light-emitting control circuit 21 is further coupled to the reference signal terminal GND and the voltage signal terminal VCC.

For example, the control signal may include address information of each pixel unit 10; the reference signal may be a grounded signal; the first voltage signal V1 is used to control a voltage of each digital module circuit inside the pixel driving chip 2. For details, reference may be made to the following content, which will not be described here.

In some embodiments, referring to FIGS. 3 to 6, the pixel driving chip 2 further includes a main processor 22. The main processor 22 is coupled to the light-emitting control circuit 21, the voltage signal terminal VCC, the control signal terminal DE and the data signal terminal DATA. The main processor 22 is configured to generate a current control signal and a plurality of pulse width modulation signals PWM according to the luminance information of the N light-emitting devices L included in the data signal, and transmit the current control signal to the constant current source circuit 212 and the plurality of pulse width modulation signals PWM to the N modulation sub-circuits in a one-to-one correspondence manner.

For example, referring to FIG. 5 again, the constant current source circuit 212 controls the magnitude of the current transmitted to the light-emitting devices L according to the current control signal.

Figure 8:
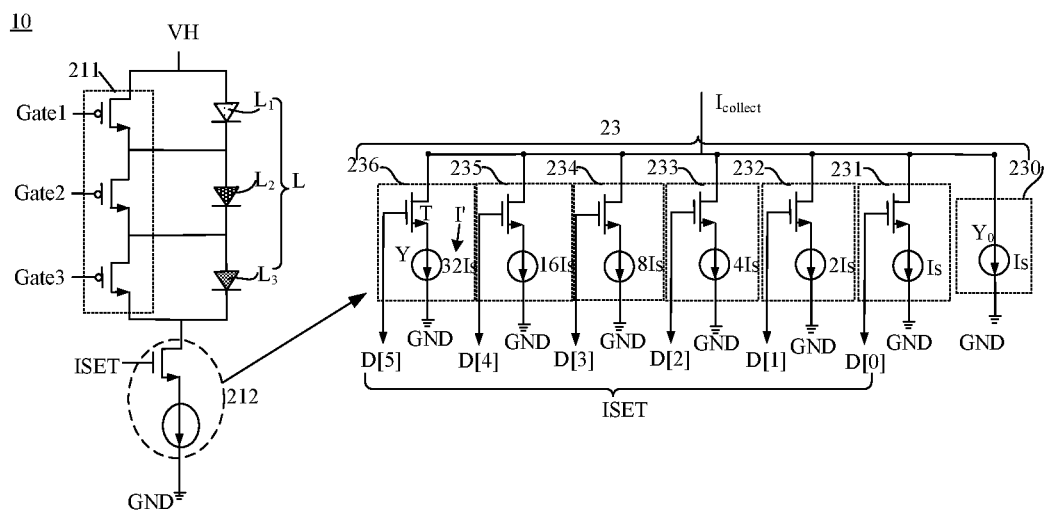
FIG. 8 is yet another structural diagram of a pixel unit, in accordance with some embodiments of the present disclosure.

Referring to FIGS. 6 and 8, the plurality of pulse width modulation signals PWM are three pulse width modulation sub-signals, and the three pulse width modulation sub-signals are a first pulse width modulation sub-signal PWMR', a second pulse width modulation sub-signal PWMG' and a third pulse width modulation sub-signal PWMB'. The first pulse width modulation sub-signal PWMR' is used to control the first modulation sub-circuit $B_1$ to be turned on or turned off, the second pulse width modulation sub-signal PWMG' is used to control the second modulation sub-circuit $B_2$ to be turned on or turned off, and the third pulse width modulation sub-signal PWMB' is used to control the third modulation sub-circuit $B_3$ to be turned on or turned off. For example, in a case where full-color display is performed, the first light-emitting device $L_1$, the second light-emitting device $L_2$ and the third light-emitting device $L_3$ enter the light-emitting phase in sequence. That is, when the first light-emitting device $L_1$ enters the light-emitting phase, a control terminal Gate1 of the first modulation sub-circuit $B_1$ receives the first pulse width modulation sub-signal PWMR' sent by a processor 22b; a control terminal Gate2 of the second modulation sub-circuit $B_2$ and a control terminal Gate3 of the third modulation sub-circuit $B_3$ each receive a signal that is at an effective level and sent by the processor 22b, so that the second light-emitting device $L_2$ and the third light-emitting device $L_3$ are short-circuited by the second modulation sub-circuit $B_2$ and the third modulation sub-circuit $B_3$, respectively, and the second light-emitting device $L_2$ and the third light-emitting device $L_3$ do not emit light; an effective light-emitting duration of the first light-emitting device $L_1$ is determined by a duty rate of the first pulse width modulation sub-signal PWMR'. When the second light-emitting device $L_2$ enters the light-emitting phase, the control terminal Gate2 of the second modulation sub-circuit $B_2$ receives the second pulse width modulation sub-signal PWMG' sent by the processor 22b; the control terminal Gate1 of the first modulation sub-circuit $B_1$ and the control terminal Gate3 of the third modulation sub-circuit $B_3$ each receive a signal that is at an effective level and sent by the processor 22b, so that the first light-emitting device $L_1$ and the third light-emitting device $L_3$ are short-circuited by the first modulation sub-circuit $B_1$ and the third modulation sub-circuit $B_3$, respectively, and the first light-emitting device $L_1$ and the third light-emitting device $L_3$ do not emit light; an effective light-emitting duration of the second light-emitting device $L_2$ is determined by a duty rate of the second pulse width modulation sub-signal PWMG'. When the third light-emitting device $L_3$ enters the light-emitting phase, the control terminal Gate3 of the third modulation sub-circuit $B_3$ receives the third pulse width modulation sub-signal PWMB' sent by the processor 22b; the control terminal Gate1 of the first modulation sub-circuit $B_1$ and the control terminal Gate2 of the second modulation sub-circuit $B_2$ each receive a signal that is at an effective level and sent by the processor 22b, so that the first light-emitting device $L_1$ and the second light emitting device $L_2$ are short-circuited by the first modulation sub-circuit $B_1$ and the second modulation sub-circuit $B_2$, respectively, and the first light-emitting device $L_1$ and the second light emitting device $L_2$ do not emit light; an effective light-emitting duration of the third light-emitting device $L_3$ is determined by a duty rate of the third pulse width modulation sub-signal PWMB'. In a frame of a display image, durations of light-emitting phases of the first light-emitting device $L_1$, the second light-emitting device $L_2$ and the third light-emitting device $L_3$ may be the same or different.

In some embodiments, as shown in FIG. 6, the main processor 22 includes the processor 22b and a control circuit 22a. The processor 22b is coupled to the N modulation sub-circuits B, and the processor 22b is configured to generate the plurality of pulse width modulation signals PWM, and transmit the plurality of pulse width modulation signals PWM to the N modulation sub-circuits B in the one-to-one correspondence manner. The processor 22b is further coupled to the control circuit 22a, and the control circuit 22a is coupled to the constant current source circuit 212. The processor 22b is further configured to generate a first signal according to the luminance information, and transmit the first signal to the control circuit 22a. The control circuit 22a is configured to generate the current control signal according to the first signal, and transmit the current control signal to the constant current source circuit 212.

For example, referring to FIG. 6 again, the first signal generated by the processor 22b according to the luminance information includes a luminance control signal, and the luminance control signal is a digital signal. The control circuit 22a generates the current control signal according to the luminance control signal, the current control signal being an analog signal, and the control circuit 22a transmits the current control signal to the constant current source circuit 212.

The modulation circuit 211 includes three modulation sub-circuits B, which are the first modulation sub-circuit $B_1$, the second modulation sub-circuit $B_2$ and the third modulation sub-circuit $B_3$. The processor 22b generates the first pulse width modulation sub-signal PWMR', the second pulse width modulation sub-signal PWMG' and the third pulse width modulation sub-signal PWMB'. The first modulation sub-circuit $B_1$, the second modulation sub-circuit $B_2$ and the third modulation sub-circuit $B_3$ may be controlled by the first pulse width modulation sub-signal PWMR', the second pulse width modulation sub-signal PWMG', and the third pulse width modulation sub-signal PWMB', respectively.

By adjusting the duty rate of each pulse width modulation sub-signal, it is possible to control a duration where each modulation sub-circuit is turned on. The duty rate refers to a ratio of a duration of an effective level to a total duration within a pulse period. For details, description is made in following content.

Figure 7A:
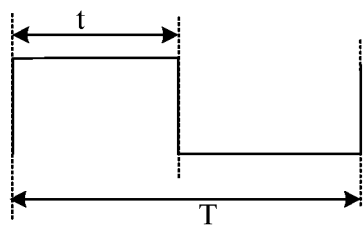
FIG. 7a is a waveform diagram of a pulse width modulation signal, in accordance with some embodiments of the present disclosure.

For the duty rate, it will be noted that, as shown in FIG. 7a, the pulse width modulation signal PWM is a square wave signal whose period duration is T and pulse width duration is t. The pulse width duration t may also be referred to as the duration of the effective level. The duty rate is equal to a ratio of the pulse width duration t to the period duration T (i.e., t/T). The period duration T of each pulse width modulation signal PWM generated and transmitted by the processor 22b is constant. However, the pulse width duration t of a different pulse width modulation signal PWM may be different. Therefore, the duty rate may be different, so that the pulse width is modulated.

For example, as shown in FIG. 6, in the case where the full-color display is performed, when the first light-emitting device $L_1$ enters the light-emitting phase, the first modulation sub-circuit is turned off. At this time, the second modulation sub-circuit and the third modulation sub-circuit are turned on, so that the second light-emitting device $L_2$ and the third light-emitting device $L_3$ are short-circuited and do not emit light. If the duty rate of the first pulse width modulation sub-signal PWMR' is relatively small, the duration where the first light-emitting device $L_1$ is short-circuited by the first modulation sub-circuit is relatively short, and the light-emitting duration of the first light-emitting device $L_1$ is relatively long, and vice versa. Therefore, by adjusting the duty rate of the pulse width modulation signal, it is possible to control the duration where a corresponding modulation sub-circuit is turned on or turned off, and thus control the light-emitting duration of a light-emitting device connected in parallel with the modulation sub-circuit to adjust the luminance of the light-emitting device.

Figure 7B:
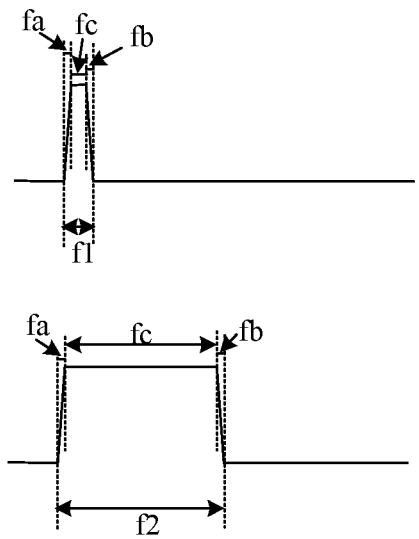
FIG. 7b is a timing diagram of a level in a rising edge period and a falling edge period in a light-emitting phase, in accordance with some embodiments of the present disclosure.

As shown in FIG. 7b, as for a digital circuit, a period in which a digital level changes from a low level to a high level is referred to as a rising edge period fa, and a period in which the digital level changes from a high level to a low level is referred to as a falling edge period fb. For example, a duration $t_{fa}$ of the rising edge period fa and a duration $t_{fb}$ of the falling edge period fb together account for a relatively high proportion in a total duration $t_{f1}$ of a high level period f1 (that is, a value of $(t_{fa}+t_{fb})/t_{f1}$ is relatively large), which results in insufficient time for the light-emitting device 1 to be in the light-emitting phase. As a result, the light-emitting luminance of the light-emitting device 1 is relatively low. For example, the duration $t_{fa}$ of the rising edge period fa and the duration $t_{fb}$ of the falling edge period fb together account for a relatively low proportion in a total duration $t_{f2}$ of a high level period f2 (that is, a value of $(t_{fa}+t_{fb})/t_{f2}$ is relatively small), so that the light-emitting device 1 has relatively sufficient time to be in the light-emitting phase. As a result, the light-emitting luminance of the light-emitting device 1 is relatively normal. The pulse width modulation signal PWM is a digital signal, which occupies S bits, and the number S determines an adjustable accuracy of the duty rate that the pixel driving chip 2 can generate. For example, in a case where the number of bits occupied by the pulse width modulation signal PWM is 10, the duty rate of the pulse width modulation signal PWM has 1024 (i.e., $2^{10}$) modes to be adjusted. The larger the number of bits occupied by the pulse width modulation signal PWM, the finer the adjustment of the duty rate.

The number of bits of the pulse width modulation signal is S, which means that, in a period T of the pulse width modulation signal, a minimum duration of the pulse (a minimum duration at the high level) is $\frac{1}{2^S}$ of the period T.

In some embodiments, referring to FIG. 6 again, the main processor 22 further includes an interface circuit 22c. The interface circuit 22c is coupled to the data signal terminal DATA, the voltage signal terminal VCC and the processor 22b, and the interface circuit 22c is configured to generate a decoded signal required by the processor 22b according to the data signal at the data signal terminal DATA and an identification signal transmitted at the voltage signal terminal VCC, and transmit the decoded signal to the processor 22b.

That is, the interface circuit 22c converts the data signal into corresponding required data, and then transmits decoded effective information to the processor 22b. For example, the interface circuit 22c decodes the luminance information and then transmits it to the processor 22b.

In some examples, as shown in FIG. 8, the constant current source circuit 212 includes a plurality of current output sub-circuits 23 that are connected in parallel, and the plurality of current output sub-circuits 23 each are configured to output a current under control of the current control signal. A total current provided by the plurality of current output sub-circuits 23 is denoted as $I_{collect}$, and the constant current source circuit 212 provides the current $I_{collect}$ to the loop where the N light-emitting devices L are located. The magnitude of the current is a sum of currents provided by current output sub-circuits 23 that are turned on under control of current information in the plurality of current output sub-circuits 23.

As shown in FIG. 8, for example, there are seven current output sub-circuits 23, which are a basic current output sub-circuit 230, a first current output sub-circuit 231, a second current output sub-circuit 232, a third current output sub-circuit 233, a fourth current output sub-circuit 234, a fifth current output sub-circuit 235 and a sixth current output sub-circuit 236.

As shown in FIG. 8, the basic current output sub-circuit 230 is not controlled by the current control signal ISET, and is in a normally-on state, and other current output sub-circuits (the first current output sub-circuit 231 to the sixth current output sub-circuit 236) are controlled by the current control signal ISET to be turned on or not. The current control signal ISET is denoted as D[M:0], and each bit in D[M:0] is used to control a different current output sub-circuit to be turned on and turned off. The number of bits of the current control signal is (M+1), so that (M+1) current output sub-circuits 23 may be controlled, and a value of a w-th bit (where w is any one of 0, 1, 2, 3, . . . , M) of the current control signal may be 0 or 1. Considering an example in which M is 5 (that is, w takes values from 0, 1, 2, 3, 4 and 5 in order), the operating states of the current output sub-circuits (the first current output sub-circuit 231 to the sixth current output sub-circuit 236) depend on the value of the w-th bit of the current control signal, respectively. Hereinafter, D[w] is used to represent the w-th bit of the current control signal. For example, in a case where D[5] is 1, the sixth current output sub-circuit 236 is turned on, and a current signal I' provided by the sixth current output sub-circuit 236 is $2^5$Is (i.e., 32Is); in a case where D[4] is 1, the fifth current output sub-circuit 235 is turned on, and a current signal I' provided by the fifth current output sub-circuit 235 is $2^4$Is (i.e., 16Is); in a case where D[4] is 0, the fifth current output sub-circuit 235 is turned off, and no current is output from the fifth current output sub-circuit 235. If the current control signal only controls the fifth current output sub-circuit 235 and the sixth current output sub-circuit 236 in the constant current source circuit 212 to be turned on, the current $I_{collect}$ provided by the constant current source circuit is 49Is ($I_{collect}$=32Is+16Is+Is=49Is). Is is a current level, and the current level is the smallest current unit that the constant current source circuit 212 can output. The current level may be 2 uA, 3 uA or 5 uA, etc., which is not limited here. In some embodiments, a magnitude of the current provided by a constant current source device Y0 included in the basic current output sub-circuit 230 is a current level value (i.e., Is).

Any one current output sub-circuit 23 in the plurality of current output sub-circuits 23 includes a transistor T and a constant current source device Y. A control electrode of the transistor T is used to receive the value of the w-th bit of the current control signal (the value of D[w]), a first electrode of the transistor T is connected to a first terminal of the constant current source device Y, and a second electrode of the transistor T is coupled to a second terminal of a last modulation sub-circuit B in the plurality of modulation sub-circuits B. That is, the second electrode of the transistor T is connected to the second terminal of the third modulation sub-circuit $B_3$. A second terminal of the constant current source device Y is used to be connected to the reference signal terminal GND. A current provided by the constant current source device of each current output sub-circuit is constant.

When the current control signal received at the control electrode of the transistor T makes the transistor T turned on, a current signal I' of the constant current source device Y connected to the transistor T is transmitted to the second terminal of the modulation sub-circuit B. Each constant current source device Y may provide a current signal I' with a constant value, and I' is a product of Is and $2^w$ (i.e., I'=Is×$2^w$), where w may take a value from 0, 1, 2, 3, 4 and 5. Each constant current source device Y may provide the constant current signal I' with a different amplitude. In a case where the transistor T controlled by D[0] is turned on, a constant current signal I' provided by the constant current source device Y connected to the transistor T is Is (I'=Is); in a case where the transistor T controlled by D[1] is turned on, a constant current signal I' provided by the constant current source device Y connected to the transistor T is 2Is (I'=2Is); in a case where the transistor T controlled by D[2] is turned on, a constant current signal I' provided by the constant current source device Y connected to the transistor T is 4Is (I'=4Is); in a case where the transistor T controlled by D[3] is turned on, a constant current signal I' provided by the constant current source device Y connected to the transistor T is 8Is (I'=8Is); in a case where the transistor T controlled by D[4] is turned on, a constant current signal I' provided by the constant current source device Y connected to the transistor T is 16Is (I'=16Is); in a case where the transistor T controlled by D[5] is turned on, a constant current signal I' provided by the constant current source device Y connected to the transistor T is 32Is (I'=32Is).

Therefore, the current $I_{collect}$ provided by the constant current source circuit 212 is a sum of currents of current signals I' of constant current source devices Y connected to turned-on transistors T in the constant current source circuit 212 and a current of the current signal Is of the basic current output sub-circuit 230. Thus, the maximum current $I_{collect\text{-}max}$ that can be output by the constant current source circuit 212 is equal to a product of Is and $2^{M-1}$ ($I_{collect\text{-}max}$=Is+Is×($2^{M+1}$−1)=Is×$2^{M-1}$). In a case where M is 5, and all transistors T are turned on, the maximum current $I_{collect}$-max that can be provided by the constant current source circuit 212 is 64Is ($I_{collect\text{-}max}$=Is+Is+2Is+4Is+8Is+16Is+32Is=Is×$2^6$=64Is).

For example, in a case where the current control signal ISET occupies 6 bits and the pulse width modulation signal occupies 10 bits, the actual light-emitting luminance of the light-emitting device L of the pixel unit 10 provided in the embodiments of the present disclosure has a positive correlation with a following expression:

$$D[5:0] \times Is \times PWM[9:0]/2^{10}.$$

In the above expression, D[5:0] determines which transistors in the constant current source circuit are turned on, Is is the current level of the constant current source circuit, (D[5:0]×Is) is the sum of the currents of the current signals I' of the constant current source devices Y connected to the turned-on transistors (i.e., $I_{collect}$ provided by the constant current source circuit), and PWM[9:0]/$2^{10}$ represents the duty rate of the pulse width modulation signal PWM.

In some examples, referring to FIG. 6 again, the pixel driving chip 2 further includes a decoder 24. The decoder 24 is coupled to the voltage signal terminal VCC and the interface circuit 22c, and the decoder 24 is configured to generate an identification signal according to the first voltage signal V1 at the voltage signal terminal VCC, and transmit the identification signal to the interface circuit 22c.

The pixel driving chip 2 further includes a voltage regulator 25. The voltage regulator 25 is coupled to the voltage signal terminal VCC and the processor 22b, and the voltage regulator 25 is configured to generate a second voltage signal V2 according to the first voltage signal V1 at the voltage signal terminal VCC, and transmit the second voltage signal V2 to the processor 22b. The second voltage signal V2 provides an operating voltage for the processor 22b.

The voltage regulator 25 is further coupled to the interface circuit 22c, the voltage regulator 25 is further configured to generate a third voltage signal V3 according to the first voltage signal V1 at the voltage signal terminal VCC, and transmit the third voltage signal V3 to the interface circuit 22c. The third voltage signal V3 provides an operating voltage for the interface circuit 22c.

The pixel driving chip 2 further includes a reference voltage circuit 26. The reference voltage circuit 26 is coupled to the voltage signal terminal VCC and the constant current source circuit 212. The reference voltage circuit 26 is configured to generate a reference voltage V0 according to the first voltage signal V1 at the voltage signal terminal VCC, and transmit the reference voltage V0 to the constant current source circuit 212.

In some examples, the modulation sub-circuit B includes a switching component.

For example, the modulation sub-circuit B includes a transistor, and the transistor includes a control electrode, a first electrode and a second electrode. The control electrode of the transistor is the control terminal of the modulation sub-circuit B, and is used to receive the pulse width modulation signal PWM; the first electrode of the transistor is the first terminal of the modulation sub-circuit B, and is used to be connected to the first electrode of the light-emitting device L; the second electrode of the transistor is the second terminal of the modulation sub-circuit B, and is used to be connected to the second electrode of the light-emitting device L.

For example, the transistor may be a device with a switching property, such as a metal-oxide semiconductor (MOS) field-effect transistor, a triode, a field-effect transistor, or a thin-film transistor, which is not limited here.

Figure 9:
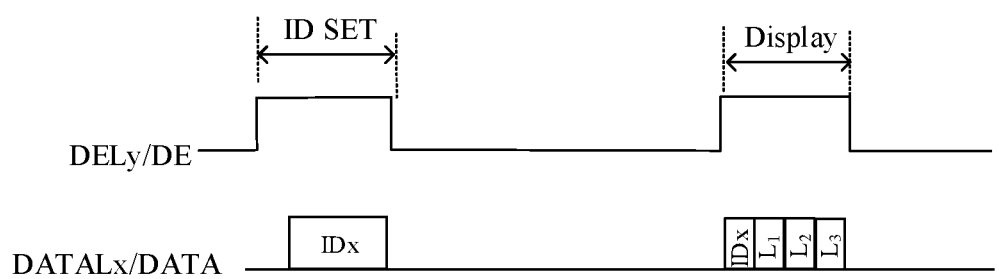
FIG. 9 is a timing diagram of a driving method of a pixel unit, in accordance with some embodiments of the present disclosure.

Some embodiments of the present disclosure further provide a driving method of the pixel unit 10. As shown in FIG. 9, the driving method includes an address assignment phase ID SET and a display phase Display.

In the address assignment phase ID SET, a control signal terminal DE of the pixel driving chip 2 receives control information, so that the pixel driving chip 2 of the pixel unit 10 is triggered; the data signal terminal DATA of the pixel driving chip 2 receives first data information, and the first data information includes address information IDx of the pixel driving chip 2.

In the display phase Display, the data signal terminal DATA of the pixel driving chip 2 receives data sub-information. The data sub-information includes address information IDx and luminance information, the address information IDx of the data sub-signal corresponds to the address information IDx received in the address assignment phase ID SET, and the luminance information includes the current signal and the pulse width modulation signals PWM for the pixel driving chip 2. Each light-emitting device L of the pixel unit 10 emits light under control of the current signal and the pulse width modulation signal PWM.

Figure 10:
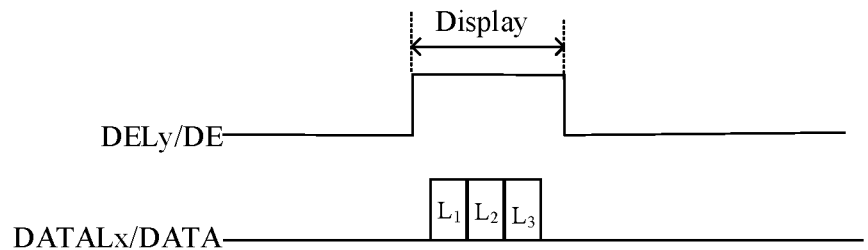
FIG. 10 is a timing diagram of another driving method of a pixel unit, in accordance with some embodiments of the present disclosure.

Some embodiments of the present disclosure also provide another driving method of the pixel unit 10, as shown in FIG. 10, the driving method includes a display phase Display in which the control signal terminal DE of the pixel driving chip 2 receives control information, so that the pixel driving chip 2 of the pixel unit 10 is triggered; the data signal terminal DATA of the pixel unit 10 receives data information, the data information includes the current signal and the pulse width modulation signals PWM that are corresponding to the pixel unit 10, and each light-emitting device L of the pixel unit 10 emits light under control of the current signal and the pulse width modulation signal PWM.

Beneficial effects of the driving method of the pixel unit are the same as those of the pixel unit 10 provided in the embodiments of the present disclosure, and details will not be repeated here.

Figure 11:
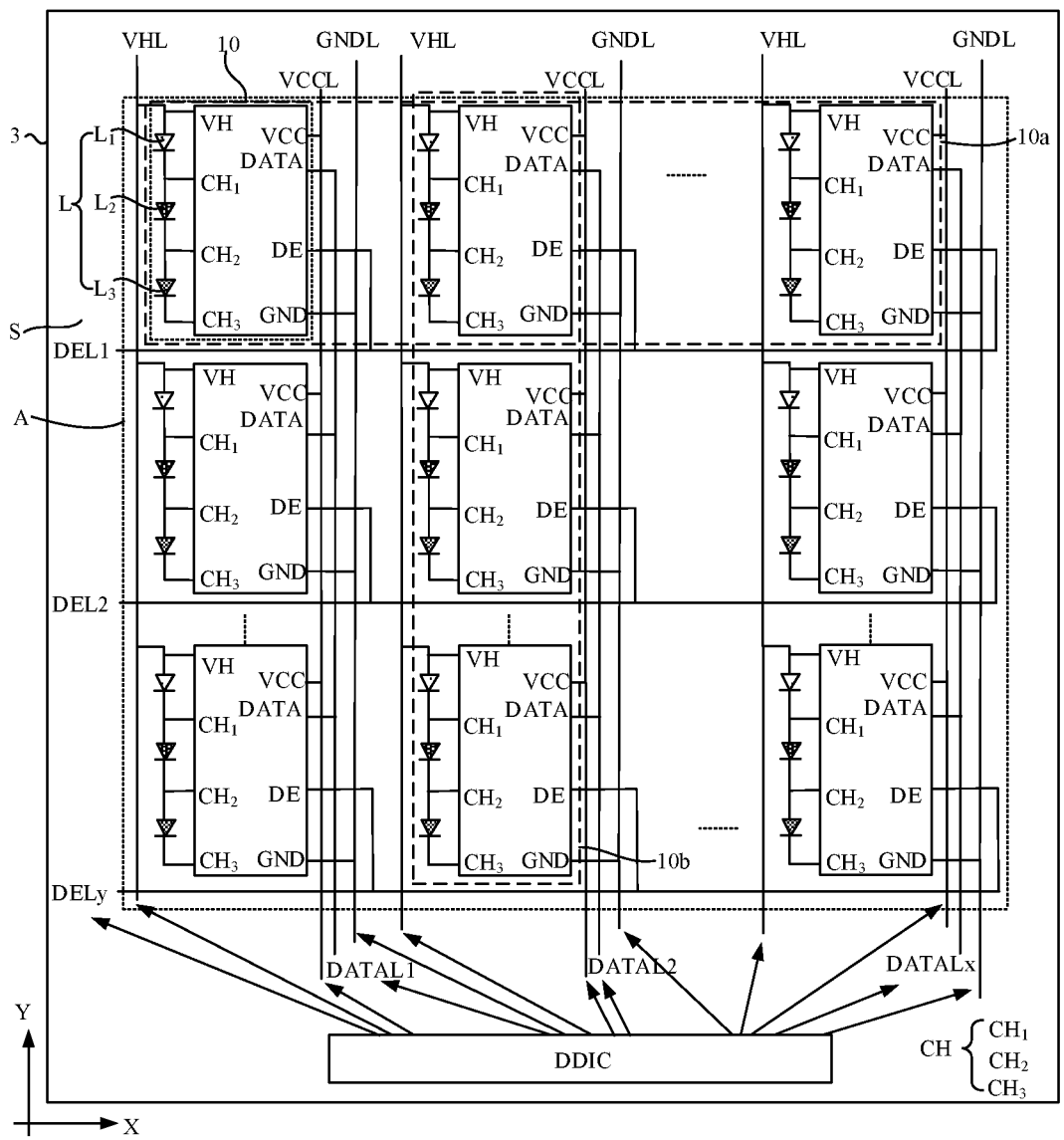
FIG. 11 is a structural diagram of a display substrate, in accordance with some embodiments of the present disclosure.

Some embodiments of the present disclosure provide a display substrate, as shown in FIG. 11, the display substrate 100 includes: a substrate 3, a plurality of pixel units 10, a plurality of power supply signal lines VHL and a plurality of data signal lines DATAL. Each of the plurality of pixel units 10 is the pixel unit 10 as described above. The plurality of pixel units 10 are disposed on a side of the substrate 3, and are arranged in an array in a first direction X and a second direction Y, the first direction X and the second direction Y intersecting each other. The plurality of power supply signal lines VHL are disposed on the side of the substrate 3, and a power supply signal line VHL in the plurality of power supply signal lines VHL is coupled to power supply signal terminals VH of pixel driving chips 2 of pixel units 10 arranged in the second direction Y. The plurality of data signal lines DATAL are disposed on the side of the substrate 3, and a data signal line DATAL in the plurality of data signal lines DATAL is coupled to data signal terminals DATA of the pixel driving chips 2 of the pixel units 10 arranged in the second direction Y.

It will be noted that, the first direction X may be a row direction, and the second direction Y may be a column direction; or the first direction X may be the column direction, and the second direction Y may be the row direction, which is not limited here. For convenience of description, in the embodiments of the present disclosure, the first direction X is the row direction, and the second direction Y is the column direction.

In some examples, referring to FIG. 11 again, the pixel units 10 arranged in the first direction X are referred to as a pixel unit row 10a, and pixel units 10 arranged in the second direction Y are referred to as a pixel unit column 10b. The power supply signal line VHL may be disposed in parallel with the pixel unit column 10b, and each power supply signal line VHL is connected to power supply signal terminals VH of pixel driving chips 2 in a pixel unit column 10b. The data signal line DATAL may be disposed in parallel with the pixel unit column 10b, and each data signal line DATAL is connected to data signal terminals DATA of the pixel driving chips 2 in the pixel unit column 10b, but the embodiments of the present disclosure are not limited thereto.

For example, there are x data signal lines DATAL, and x is a positive integer greater than or equal to 1. A first data signal line DATAL is denoted as DATAL1, a second data signal line DATAL is denoted as DATAL2, and an x-th data signal line DATAL is denoted as DATALx. The value of x may be the same as the number of pixel unit columns 10b.

In some embodiments, referring to FIG. 11 again, the pixel unit 10 includes: the control signal terminal DE, the reference signal terminal GND and the voltage signal terminal VCC. The display substrate 100 further includes: a plurality of control signal lines DEL, a plurality of reference signal lines GNDL and a plurality of voltage signal lines VCCL. The plurality of control signal lines DEL are disposed on the side of the substrate 3, and a control signal line DEL in the plurality of control signal lines DEL is coupled to control signal terminals DE of pixel driving chips 2 of the pixel units 10 arranged in the first direction X. The plurality of reference signal lines GNDL are disposed on the side of the substrate 3, and a reference signal line GNDL in the plurality of reference signal lines GNDL is coupled to reference signal terminals GND of the pixel driving chips 2 of the pixel units 10 arranged in the second direction Y. The plurality of voltage signal lines VCCL are disposed on the side of the substrate 3, and a voltage signal line VCCL in the plurality of voltage signal lines VCCL is coupled to voltage signal terminals VCC of the pixel driving chips 2 of the pixel units 10 arranged in the second direction Y.

For example, as shown in FIG. 11, the control signal line DEL may be disposed in parallel with the pixel unit row 10a, and each control signal line DEL is connected to control signal terminals DE of pixel driving chips 2 in a pixel unit row 10a, but the embodiments of the present disclosure are not limited thereto. There may be y control signal lines DEL, and y is a positive integer greater than or equal to 1. A first control signal line DEL is denoted as DEL1, a second control signal line DEL is denoted as DEL2, and a y-th control signal line DEL is denoted as DELy, y may be the same as the number of the pixel unit rows 10a.

The reference signal line GNDL may be disposed in parallel with the pixel unit column 10b, and each reference signal line GNDL is connected to reference signal terminals GND of pixel driving chips 2 in a pixel unit column 10b, but the embodiments of the present disclosure are not limited thereto. The voltage signal line VCCL may be disposed in parallel with the pixel unit column 10b, and each voltage signal line VCCL is connected to voltage signal terminals VCC of the pixel driving chips 2 in a pixel unit column 10b, but the embodiments of the present disclosure are not limited thereto.

In some embodiments, referring to FIG. 11 again, the control signal lines DEL extend along the first direction X and are arranged in the second direction Y. The control signal line DEL is located in a spacing between two adjacent lines of pixel units 10 that are arranged in the second direction Y. The power supply signal lines VHL, the data signal lines DATAL, the voltage signal lines VCCL and the reference signal lines GNDL extend along the second direction Y and are arranged in the first direction X. The power supply signal line VHL, the data signal line DATAL, the voltage signal line VCCL and the reference signal line GNDL are located in a spacing between two adjacent lines of pixel units 10 that are arranged in the first direction X.

For example, as shown in FIG. 11, the control signal line DEL is located in a spacing between two adjacent pixel unit rows 10a, and the power supply signal line VHL, the data signal line DATAL, the voltage signal line VCCL and the reference signal line GNDL are located in a spacing between two adjacent pixel unit columns 10b. In this way, it may be more convenient for the signal line to be connected to pixel driving chips 2 in a corresponding line of pixel units 10, which facilitates wiring arrangement and prevents crossing between the signal lines.

Compared with the display panel 100' driven in the PM manner, for the display substrate 100 provided in the embodiments of the present disclosure, the number of signal lines on the substrate 3 is greatly reduced, so that the display substrate 100 has enough space for arranging the signal lines. The resistance of the signal line may be reduced through wiring manners such as increasing the width of the signal line, and in a case where the thickness of the signal line is not increased, the luminance of the light-emitting device L may be increased, thereby reducing the power of the display substrate 100. In addition, for the display substrate 100 provided in the embodiments of the present disclosure, the number of signal lines is reduced, and thus a width of a bonding region and difficulty for bonding the signal lines on the bonding region are reduced. The signal lines include the control signal lines DEL, the power supply signal lines VHL, the data signal lines DATAL, the voltage signal lines VCCL and the reference signal lines GNDL.

In some embodiments, referring to FIG. 11 again, the display substrate 100 further includes a control chip DDIC, the control chip DDIC is connected to the data signal lines DATAL and the control signal lines DEL. The control chip DDIC is configured to provide the data signal to the data signal line DATAL and the control signal to the control signal line DEL.

For example, as shown in FIG. 11, the display substrate 100 has a display area A and a peripheral area S surrounding the display area A, the pixel units 10 are located in the display area A, and the control chip DDIC may be disposed in the peripheral area S.

The control chip DDIC provides the control signal to the control signal line DEL, and control signal terminals DE of pixel driving chips 2 connected to the control signal line DEL receives the control signal, so that the pixel driving chips 2 are triggered. The control chip DDIC provides the data signal to the data signal line DATAL, and data signal terminals DATA of pixel driving chips 2 connected to the data signal line DATAL receives the data signal. The data signal includes address information of a pixel unit 10 where the pixel driving chip 2 is located, the current signal and the pulse width modulation signals.

Beneficial effects of the display substrate 100 are the same as those of the pixel unit 10 provided in the embodiments of the present disclosure, which will not be repeated here.

Figure 12:
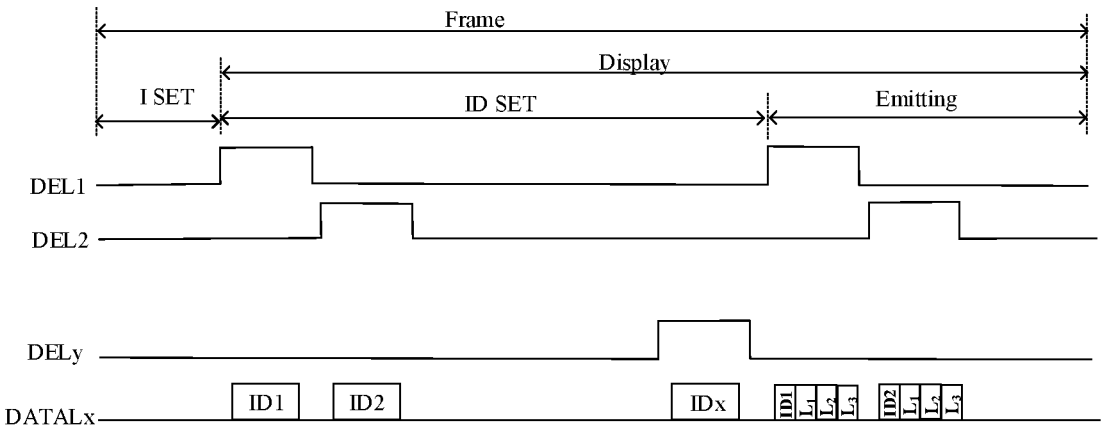
FIG. 12 is a timing diagram of a driving method of a display substrate, in accordance with some embodiments of the present disclosure.
Figure 13:
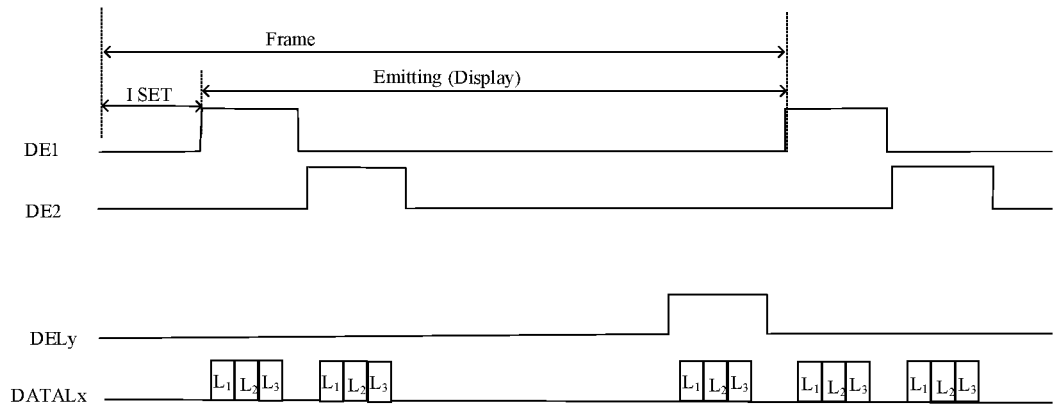
FIG. 13 is another timing diagram of a driving method of a display substrate, in accordance with some embodiments of the present disclosure.

Some embodiments of the present disclosure provide a driving method of a display substrate. As shown in FIGS. 12 and 13, each display frame Frame of the display substrate 100 includes a data signal setting phase I SET and a display phase Display, and the data signal includes a current signal and pulse width modulation signals. As shown in FIG. 11, the display substrate 100 includes a plurality of pixel units 10 and a control chip DDIC, and each of the plurality of pixel units 10 includes N light-emitting devices L.

Figure 14:
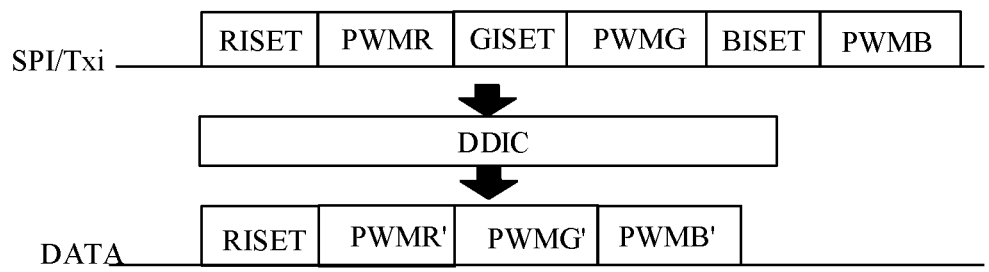
FIG. 14 is a diagram showing signals in a data signal setting phase I SET, in accordance with some embodiments of the present disclosure.

As shown in FIG. 14, the data signal setting phase I SET includes a first step and a second step.

In the first step, the control chip DDIC receives an image signal Txi of an i-th frame, the image signal Txi of the i-th frame includes an initial current signal and an initial pulse width modulation signal that are corresponding to the N light-emitting devices L of each pixel unit 10 in the plurality of pixel units 10 in a current frame of image. The initial current signal includes N initial current sub-signals, and the initial pulse width modulation signal includes N initial pulse width modulation sub-signals with a same bit wide (i.e., number of bits).

In the second step, the control chip DDIC processes the initial current signal to generate the current signal, and the current signal includes an initial current sub-signal with the largest current amplitude in the N initial current sub-signals. The control chip DDIC processes the initial pulse width modulation signal to generate the pulse width modulation signals, and the pulse width modulation signals are N pulse width modulation sub-signals with different number of bits. i is a positive integer greater than or equal to 1, and N is a positive integer greater than 1. It can be understood that, when the display apparatus operates normally, the initial current signal and the initial pulse width modulation signal of the image signal Txi of the i-th frame sent by a system circuit are both signals after Gamma correction. That is, the current signal and the pulse width modulation signal are generated by the control chip DDIC according to the received initial current signal and initial pulse width modulation signal that have undergone Gamma correction, respectively.

In the display phase Display, the N light-emitting devices L in each of the plurality of pixel units 10 emit light under control of a corresponding current signal and corresponding pulse width modulation signals PWM.

For example, referring to FIG. 14 again, in the first step, the image signal Txi of the i-th frame includes the initial current signal and the initial pulse width modulation signal that are corresponding to three light-emitting devices L in each of the plurality of pixel units 10 in the current frame of image.

The three light-emitting devices L are a first light-emitting device $L_1$, a second light-emitting device $L_2$ and a third light-emitting device $L_3$. The first light-emitting device $L_1$ is configured to emit red light, the second light-emitting device $L_2$ is configured to emit green light, and the third light-emitting device $L_3$ is configured to emit blue light.

The initial current signal includes three initial current sub-signals. An initial current sub-signal corresponding to the first light-emitting device $L_1$ is RISET, an initial current sub-signal corresponding to the second light-emitting device $L_2$ is GISET, and an initial current sub-signal corresponding to the third light-emitting device $L_3$ is BISET.

The initial pulse width modulation signal includes three initial pulse width modulation sub-signals. An initial pulse width modulation sub-signal corresponding to the first light-emitting device $L_1$ is PWMR, an initial pulse width modulation sub-signal corresponding to the second light-emitting device $L_2$ is PWMG, and an initial pulse width modulation sub-signal corresponding to the third light-emitting device $L_3$ is PWMB. Bit wide of the three initial pulse width modulation sub-signals are the same. For example, the three initial pulse width modulation sub-signals all have 10 bits.

It will be noted that, a sum of the bit numbers of the initial pulse width modulation signal and the initial current signal is equal to the bit number of packetized data signal. For example, the packetized data signal has 16 bits, the initial current signal has 6 bits, and thus the initial pulse width modulation signal has 10 bits.

Figure 15:
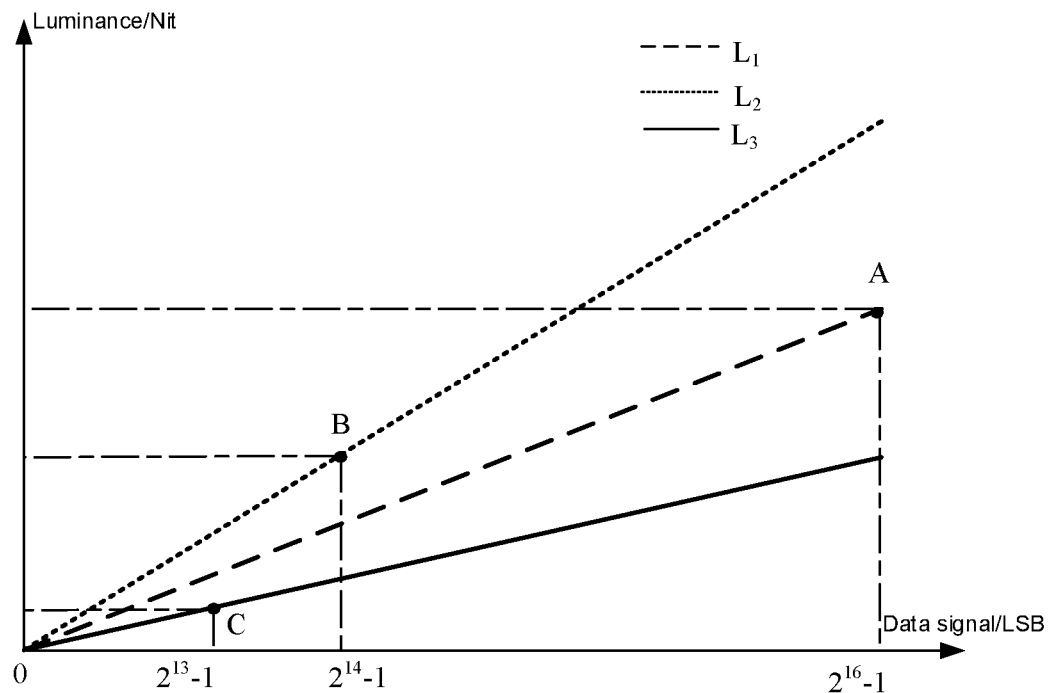
FIG. 15 is a curve graph showing a relationship between luminance of each light-emitting device and a current on the light-emitting device, in accordance with some embodiments of the present disclosure.

When full-color display is achieved, current amplitudes of the initial current sub-signals of the three light-emitting devices L may be determined according to a luminance difference between the first light-emitting device $L_1$, the second light-emitting device $L_2$ and the third light-emitting device $L_3$ under a 16-bit data signal in a luminance curve, and a relationship between the data signal and the luminance of the three light-emitting devices L is shown in FIG. 15. The horizontal axis represents the 16-bit data signal, the unit of which is LSB, and the vertical axis represents the luminance of the light-emitting device L, the unit of which is Nit. It can be seen from FIG. 15 that the luminance of the first light-emitting device $L_1$, the second light-emitting device $L_2$ and the third light-emitting device L3 all increase as the value of the data signal increases.

In a case where each of the first light-emitting device $L_1$, the second light-emitting device $L_2$ and the third light-emitting device $L_3$ in the pixel unit is independently controlled by the 16-bit data signal (including the 6-bit initial current signal and the 10-bit initial pulse width modulation signal), and considering an example in which the pixel unit as a whole displays white with preset luminance, light-emitting luminance of the first light-emitting device $L_1$, light-emitting luminance of the second light-emitting device $L_2$ and light-emitting luminance of the third light-emitting device $L_3$ of the pixel unit are not necessarily the same; in some cases, when the pixel unit displays white with the preset luminance, the light-emitting luminance of the first light-emitting device $L_1$ is greater than the light-emitting luminance of the second light-emitting device $L_2$, and the light-emitting luminance of the second light-emitting device $L_2$ is greater than the light-emitting luminance of the third light-emitting device $L_3$. The light-emitting luminance of the first light-emitting device $L_1$ is the maximum luminance that the first light-emitting device $L_1$ can achieve.

According to the curve showing the relationship between the data signal and the luminance of each light-emitting device in FIG. 15, the value of the data signal corresponding to each light-emitting device is obtained according to an intersection point (the intersection point A, B, or C) between the light-emitting luminance of each light-emitting device and the curve. Referring to FIG. 14, for the 16-bit data signal corresponding to the first light-emitting device $L_1$, the duty rate of the 10-bit initial pulse width modulation sub-signal PWMR is 100%, and a current corresponding to current information carried in the initial current sub-signal RISET is 64Is $(((2^{16}-1)+1)/2^{10})$; for the 16-bit data signal corresponding to the second light-emitting device $L_2$, the duty rate of the 10-bit initial pulse width modulation sub-signal PWMG is 100%, and a current corresponding to current information carried in the initial current sub-signal GISET is 16Is $(((2^{14}-1)+1)/2^{10})$; for the 16-bit data signal corresponding to the third light-emitting device $L_3$, the duty rate of the 10-bit initial pulse width modulation sub-signal PWMB is 100%, and a current corresponding to current information carried in the initial current sub-signal BISET is 8Is $(((2^{13}-1)+1)/2^{10})$.

In the second step, the control chip DDIC firstly processes the initial current signal to generate the current signal, and the current signal includes the initial current sub-signal with the largest current amplitude in the three initial current sub-signals. For example, the current corresponding to the current information carried in the initial current sub-signal RISET is 64Is, the current corresponding to the current information carried in the initial current sub-signal GISET is 16Is, and the current corresponding to the current information carried in the initial current sub-signal BISET is 8Is; the initial current sub-signal RISET is the initial current sub-signal with the largest current amplitude in the three initial current sub-signals. Therefore, the current of the current signal is 64Is. Then, the control chip DDIC processes the initial pulse width modulation signal to generate the pulse width modulation signal PWM, and the pulse width modulation signal PWM includes three pulse width modulation sub-signals (the pulse width modulation sub-signal PWMR', the pulse width modulation sub-signal PWMG' and the pulse width modulation sub-signal PWMB') with different effective bits. In the embodiments of the present disclosure, the first light-emitting device $L_1$, the second light-emitting device $L_2$ and the third light-emitting device $L_3$ belonging to the same pixel unit share a constant current source circuit 212. That is, the current amplitude in the loop where the light-emitting devices L are located is 64Is. Therefore, the control chip DDIC needs to generate the pulse width modulation sub-signals (the pulse width modulation sub-signal PWMR', the pulse width modulation sub-signal PWMG' and the pulse width modulation sub-signal PWMB') with different effective bits according to the current amplitude of the initial current sub-signal corresponding to the three light-emitting devices L that are independently controlled in the same pixel unit, so as to ensure that the pixel unit can display white with the preset luminance. For example, the effective bits of the 10-bit PWMR' signal are still 10 bits. That is, the duty rate of the PWMR' signal is 1. However, the effective bits of the 10-bit PWMG' signal are only 8 bits. In a case where the second modulation sub-circuit includes the P-type transistor, the highest bit and the second highest bit of the PWMG' signal are fixedly assigned as 0 (that is, the maximum duty rate of PWMG' signal is 0.25 (i.e., GISET/RISET=16/64)); in a case where the second modulation sub-circuit includes an N-type transistor, the processor 22*b* will assign the lowest bit and the second lowest bit of the PWMG' signal as 1 (that is, the minimum duty rate of PWMG' signal is 0.75 (i.e., 1−GISET/RISET=1−16/64)). The effective bits of the 10-bit PWMB' signal are only 7 bits, and in a case where the third modulation sub-circuit includes a P-type transistor, the processor 22*b* will assign the highest bit, the second highest bit, and the third highest bit of the PWMB' signal as 0 (that is, the maximum duty rate of the PWMB' signal is 0.125 (i.e., BISET/RISET=8/64)); in a case where the third modulation sub-circuit includes an N-type transistor, the processor 22*b* will assign the lowest bit, the second lowest bit and the third lowest bit of the PWMB' signal as 1 (that is, the minimum duty rate of the PWMB' signal is 0.875 (i.e., 1−BISET/RISET=1−8/64)). It can be understood that the effective bit is the number of bits that can be assigned as "0" or "1" of the digital signal. By assigning the effective bits of the pulse width modulation sub-signals (the pulse width modulation sub-signal PWMR', the pulse width modulation sub-signal PWMG' and the pulse width modulation sub-signal PWMB'), the pulse width modulation sub-signals (the pulse width modulation sub-signal PWMR', the pulse width modulation sub-signal PWMG' and the pulse width modulation sub-signal PWMB') may have different duty rates, so that the pixel unit displays white with different luminance.

The current signal generated by the control chip DDIC in the technical solution of the present disclosure is the initial current sub-signal with the largest current amplitude in the initial current sub-signals, so that a total output current of the control chip DDIC is greatly reduced, and the system power consumption requirement is also greatly reduced. For example, in the related art, the pixel unit displays white with the preset luminance, the first light-emitting device $L_1$ needs a current of 10 mA, the second light-emitting device $L_2$ needs a current of 5 mA, and the third light-emitting device $L_3$ needs a current of 6 Ma. Thus, the total output current of the control chip DDIC is a sum of the currents required by the three light-emitting devices L. That is, the total output current is 21 mA (10 mA+5 mA+6 mA=21 mA). However, in the technical solution of the present disclosure, the pixel unit displays white with the same preset luminance, which may be achieved as long as the total output current required by the three light-emitting devices L is the maximum value of the current required by the three light-emitting devices L. That is, the total output current is 10 mA. In this case, the power consumption may be effectively reduced.

In some examples, it is necessary to perform the Gamma correction on the curve of the relationship between the data signal (the initial current signal and the initial pulse width modulation signal) and the luminance provided in FIG. 15 to ensure that a smooth Gamma curve is obtained, so as to improve the contrast of the display apparatus. Therefore, it can be understood that, when the display apparatus operates normally, the initial current signal and the initial pulse width modulation signal received by the control chip DDIC are the initial current signal and the initial pulse width modulation signal that have undergone Gamma correction.

In some examples, before the data signal setting phase I SET, further includes a current level Is setting phase.

Referring to FIG. 8 again, the current level Is may be set by the constant current source circuit 212 in the pixel driving chip 2. For example, the current level Is may be 2 uA, 3 uA or 5 uA, which is no limited here. The value of the current signal I' provided by the constant current source device Y of each current output sub-circuit 23 in the constant current source circuit 212 is related to the current level Is set by the constant current source circuit 212. As described above, the control chip DDIC generates the 6-bit current signal, and the current signal I' with the constant value that may be provided by each constant current source device Y is the product of Is and $2^w$ (i.e., $I'=Is \times 2^w$), where w is a positive integer greater than or equal to 0 and less than and equal to 5. Therefore, the current signal I' with the constant value that may be provided by each constant current source device Y is determined by w and the current level Is. As a result, the magnitude of the current $I_{collect}$ provided by the constant current source circuit 212 is determined.

In some other examples, the current level Is may be directly set by the control chip DDIC, so that the current level Is is constant.

In some embodiments, as shown in FIG. 12, the display phase Display includes: an address assignment phase ID SET and a light-emitting phase Emitting, and the display substrate 100 includes a plurality of control signal lines DEL and a plurality of data signal lines DATAL.

In the address assignment phase ID SET, the control chip DDIC sequentially inputs control information to each control signal line DEL, and the control chip DDIC inputs first data information to each data signal line DATAL. The first data information includes address information ID corresponding to the pixel units 10 arranged in the second direction Y. It can be understood that, after the display apparatus is powered on, when the first frame is displayed, the display phase Display needs to include the address assignment phase ID SET; and when other subsequent frame is displayed, the display phase Display may not include the address assignment phase ID SET.

In the light-emitting phase Emitting, the control chip DDIC inputs second data information to each data signal line DATAL. The second data information includes a plurality of pieces of data sub-information. The piece of data sub-information includes: address information ID corresponding to each pixel unit 10, and a current signal and a pulse width modulation signal that are corresponding to the address information ID and corresponding to a pixel driving chip 2 of the pixel unit 10 coupled to the data signal line DATAL.

It can be understood that, when the display apparatus operates normally, the initial current signal and the initial pulse width modulation signal in the image signal Txi of the i-th frame sent by the system circuit 200 are both signals after Gamma correction. That is, the current signal and the pulse width modulation signal are generated by the control chip DDIC according to the received initial current signal and initial pulse width modulation signal that have undergone Gamma correction.

For example, referring to FIGS. 11 and 12 again, the control signal terminals DE of the pixel driving chips 2 in the pixel unit row 10a are connected to a control signal line DEL, and the data signal terminals DATA of the pixel driving chips 2 in the pixel unit column 10b are connected to a data signal line DATAL. In the address assignment phase ID SET, the control chip DDIC inputs the first data information to the pixel driving chips 2 in the plurality of pixel unit columns 10b through the plurality of data signal lines DATAL, the control chip DDIC inputs the control information to the pixel driving chips 2 in the plurality of pixel unit rows 10a through the plurality of control signal lines DEL, so as to control data signal terminals DATA of pixel driving chips 2 located in a same pixel unit row 10a to receive first data information transmitted from different data signal lines DATAL simultaneously.

In the light-emitting phase Emitting, under control of the control information transmitted on the control signal lines DEL, the control chip DDIC inputs the second data information to the pixel driving chips 2 in the plurality of pixel unit columns 10b through the plurality of data signal lines DATAL. Each piece of the second data information includes a plurality of pieces of data sub-information. For example, in the case where the display substrate 100 includes y pixel unit rows 10a, each piece of data sub-information includes y pieces of data sub-information. The address information ID included in each piece of data sub-information corresponds to the address information ID received by each pixel driving chip 2 in the address assignment phase ID SET.

The second data information is transmitted to the pixel driving chips 2 in the same pixel unit columns 10b through the data signal line DATAL, and each pixel driving chip 2 selectively receives data sub-information corresponding to the same address information ID received and stored in the address assignment phase ID SET by decoding and matching the address information ID in the plurality of pieces data sub-information in the second data information, so as to obtain the current signal and pulse width modulation signal in the data sub-information. The light-emitting devices L in the pixel unit 10 emit light according to the current signal and the pulse width modulation signal. It can be understood that, when the display apparatus operates normally, the initial current signal and the initial pulse width modulation signal in the image signal Txi of the i-th frame sent by the system circuit 200 are both signals after Gamma correction. That is, the current signal and the pulse width modulation signal are generated by the control chip DDIC according to the received initial current signal and initial pulse width modulation signal that have undergone Gamma correction.

In some embodiments, as shown in FIG. 13, the display substrate 100 includes a plurality of control signal lines DEL and a plurality of data signal lines DATAL, and the light-emitting phase Emitting includes:

inputting control information to an m-th control signal line DEL; inputting data information to each data signal line DATAL, the data information including the current signal and the pulse width modulation signal corresponding to the pixel driving chip 2 of the pixel unit 10 coupled to the data signal line DATAL, m being any positive integer of 1 to M, inclusive, and M being the number of all control signal lines DEL arranged in the second direction Y; and sequentially inputting, by the control chip DDIC, the control information to the control signal lines (a first control signal line to an M-th control signal line).

For example, referring to FIGS. 11 and 13 again, in the case where the display substrate 100 includes y pixel unit rows 10a, the number of all control signal lines DEL arranged in the second direction Y is y. That is, M is equal to y (M=y). In the light-emitting phase Emitting, light-emitting devices L in pixel units 10 in the pixel unit row 10a emit light simultaneously. Light-emitting devices L in pixel units 10 in a first pixel unit row 10a to light-emitting devices L in pixel units 10 in a last pixel unit row 10a emit light row by row, so that a display frame Frame is formed.

Considering an example in which the light-emitting devices L in the pixel units 10 in the first pixel unit row 10a emit light, the first control signal line DEL inputs the control signal to control signal terminals DE of the pixel driving chips 2 of the pixel units 10 in the first pixel unit row 10a, so that the pixel driving chips 2 of the pixel units 10 in the first pixel unit row 10a are triggered. At this time, the data signal lines DATAL input data information, and data signal terminals DATA of the pixel driving chips 2 of the pixel units 10 in the first pixel unit row 10a receive the data information. Therefore, the light-emitting devices L of each pixel unit 10 in the first pixel unit row 10a emit light under control of the current signal and the pulse width modulation signal included in the data information.

The light-emitting devices L of the pixel units 10 in the first pixel unit row 10a to the light-emitting devices L of the pixel units 10 in the last pixel unit row 10a emit light in sequence, and thus the frame of image Frame is displayed.

Beneficial effects of the driving method of the display substrate are the same as those of the display substrate 100 provided in the embodiments of the present disclosure, and details will not be repeated here.

Figure 16:
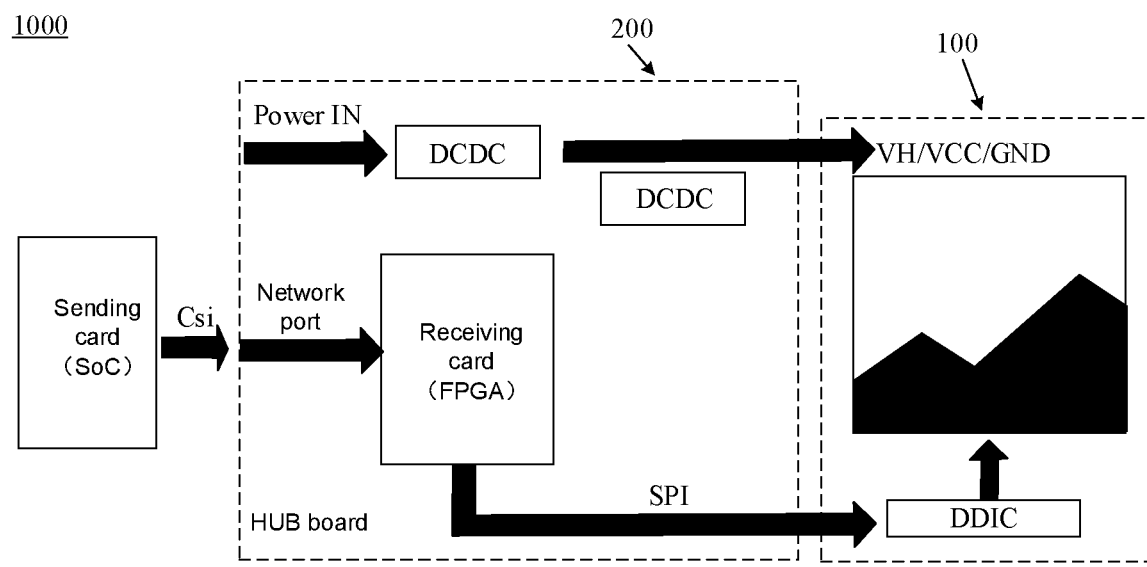
FIG. 16 is a structural diagram of a display apparatus, in accordance with some embodiments of the present disclosure.

Some embodiments of the present disclosure provide the display apparatus 1000. As shown in FIG. 16, the display apparatus 1000 includes the display substrate 100. The display substrate 100 includes the control chip DDIC, the display apparatus 1000 further includes a system circuit 200 coupled to the display substrate 100, and the system circuit 200 is configured to provide the initial current signal and the initial pulse width modulation signal to the control chip DDIC.

For example, referring to FIG. 16 again, the system circuit 200 receives an initial signal Csi related to a display image of the i-th frame, generates the image signal Txi of the i-th frame after performing a series of processing such as rendering and decoding on the initial signal Csi, and outputs the image signal Txi of the i-th frame based on a first frequency. After the input terminal of the control chip DDIC receives the image signal Txi of the i-th frame at the first frequency, the control chip DDIC processes the image signal Txi of the i-th frame and generates an i-th driving control signal, and outputs the i-th driving control signal to the pixel driving chips 2 of the pixel units 10 through the signal lines at a second frequency. The driving control signal includes the data information, the power supply signal, the control signal, the reference signal and the first voltage signal V1. The image signal Txi of the i-th frame includes data transmitted in a SPI format, and the data includes all electrical signal information required by the pixel unit 10.

Beneficial effects of the display apparatus 1000 are the same as those of the display substrate 100 provided in the embodiments of the present disclosure, and details will not be repeated here.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A pixel unit comprising: N light-emitting devices and a pixel driving chip, wherein
   the pixel driving chip includes:
   a data signal terminal used to receive a data signal;
   a power supply signal terminal used to receive a power supply signal; and
   N signal channel terminals that are in one-to-one correspondence with the N light-emitting devices;
   wherein a first electrode of a first light-emitting device in the N light-emitting devices is configured to be coupled to the power supply signal terminal, a second electrode of an n-th light-emitting device in the N light-emitting devices is coupled to a first electrode of an (n+1)-th light-emitting device and an n-th signal channel terminal in the N signal channel terminals; N is a positive integer greater than 1, and n is a positive integer greater than or equal to 1 and less than or equal to N.

2. The pixel unit according to claim 1, wherein the pixel driving chip further includes a light-emitting control circuit coupled to the N signal channel terminals, the power supply signal terminal, and the data signal terminal, and the light-emitting control circuit is configured to control a magnitude of a current transmitted to the N light-emitting devices and a light-emitting duration of each light-emitting device according to luminance information of the N light-emitting devices, so as to control actual light-emitting luminance of each light-emitting device.

3. The pixel unit according to claim 2, wherein the light-emitting control circuit includes a modulation circuit and a constant current source circuit, a terminal of the modulation circuit is coupled to the power supply signal terminal, and another terminal of the modulation circuit is coupled to the constant current source circuit.

4. The pixel unit according to claim 3, wherein the modulation circuit includes N modulation sub-circuits that are in one-to-one correspondence with the N signal channel terminals; each modulation sub-circuit in the N modulation sub-circuits includes a control terminal, a first terminal and a second terminal; a first terminal of a first modulation sub-circuit in the N modulation sub-circuits is coupled to the power supply signal terminal, and a second terminal of an n-th modulation sub-circuit in the N modulation sub-circuits is coupled to a first terminal of an (n+1)-th modulation sub-circuit in the N modulation sub-circuits and the n-th signal channel terminal in the N signal channel terminals.

5. The pixel unit according to claim 4, wherein the pixel driving chip further includes:
   a control signal terminal used to receive a control signal;
   a reference signal terminal used to receive a reference signal; and
   a voltage signal terminal used receive a first voltage signal;
   wherein the constant current source circuit of the light-emitting control circuit is further coupled to the reference signal terminal and the voltage signal terminal.

6. The pixel unit according to claim 5, wherein the pixel driving chip further includes: a main processor coupled to the light-emitting control circuit, the voltage signal terminal, the control signal terminal and the data signal terminal;
   the main processor is configured to generate a current control signal and a plurality of pulse width modulation signals according to the luminance information of the N light-emitting devices included in the data signal, and transmit the current control signal to the constant current source circuit and transmit the plurality of pulse width modulation signals to the N modulation sub-circuits in a one-to-one correspondence manner.

7. The pixel unit according to claim 6, wherein the main processor includes a processor and a control circuit;
   the processor is coupled to the N modulation sub-circuits, and the processor is configured to generate the plurality of pulse width modulation signals, and transmit the plurality of pulse width modulation signals to the N modulation sub-circuits in the one-to-one correspondence manner;
   the processor is further coupled to the control circuit, and the control circuit is coupled to the constant current source circuit; the processor is further configured to generate a first signal according to the luminance information, and transmit the first signal to the control circuit; the control circuit is configured to generate the current control signal according to the first signal, and transmit the current control signal to the constant current source circuit.

8. The pixel unit according to claim 7, wherein the main processor further includes an interface circuit, the interface circuit is coupled to the data signal terminal, the voltage signal terminal and the processor; the interface circuit is configured to generate a decoded signal required by the processor according to the data signal at the data signal terminal and an identification signal transmitted at the voltage signal terminal, and transmit the decoded signal to the processor.

9. The pixel unit according to claim 4, wherein the modulation sub-circuit includes a switching component.

10. The pixel unit according to claim 1, wherein the N light-emitting devices include: a red light-emitting device, a green light-emitting device and a blue light-emitting device.

11. A display substrate, comprising:
    a substrate;
    a plurality of pixel units, wherein each pixel unit in the plurality of pixel units is the pixel unit according to claim 1, the plurality of pixel units are disposed on a side of the substrate, and the plurality of pixel units are arranged in an array in a first direction and a second direction; the first direction and the second direction intersect each other;
    a plurality of power supply signal lines disposed on the side of the substrate, wherein a power supply signal line in the plurality of power supply signal lines is coupled to power supply signal terminals of pixel driving chips of pixel units arranged in the second direction; and
    a plurality of data signal lines disposed on the side of the substrate, wherein a data signal line in the plurality of data signal lines is coupled to data signal terminals of the pixel driving chips of the pixel units arranged in the second direction.

12. The display substrate according to claim 11, wherein the pixel unit further includes: a control signal terminal, a reference signal terminal and a voltage signal terminal;
    the display substrate further includes:
    a plurality of control signal lines disposed on the side of the substrate, wherein a control signal line in the plurality of control signal lines is coupled to control signal terminals of pixel driving chips of pixel units arranged in the first direction;
    a plurality of reference signal lines disposed on the side of the substrate, wherein a reference signal line in the plurality of reference signal lines is coupled to reference signal terminals of pixel driving chips of the pixel units arranged in the second direction; and
    a plurality of voltage signal lines disposed on the side of the substrate, wherein a voltage signal line in the plurality of voltage signal lines is coupled to voltage signal terminals of the pixel driving chips of the pixel units arranged in the second direction.

13. The display substrate according to claim 12, wherein the plurality of control signal lines extend along the first direction and are arranged in the second direction, and the control signal line is located in a spacing between two adjacent lines of pixel units that are arranged in the second direction;
    the plurality of power supply signal lines, the plurality of data signal lines, the plurality of voltage signal lines and the plurality of reference signal lines extend along the second direction and are arranged in the first direction, and the power supply signal line, the data signal line, the voltage signal line and the reference signal line are located in a spacing between two adjacent lines of pixel units that are arranged in the first direction.

14. The display substrate according to claim 11, wherein the display substrate further comprises a control chip, the control chip is connected to the plurality of data signal lines and the plurality of control signal lines, and the control chip is configured to provide the data signal to the data signal line and the control signal to the control signal line.

15. A display apparatus, comprising the display substrate according to claim 11.

16. The display apparatus according to claim 15, wherein the display substrate further includes a control chip, the display apparatus further comprises a system circuit coupled to the control chip, and the system circuit is configured to provide an initial current signal and an initial pulse width modulation signal to the control chip.

17. The pixel unit according to claim 8, wherein the pixel driving chip further includes a decoder coupled to the voltage signal terminal and the interface circuit, the decoder is configured to generate the identification signal according to the first voltage signal at the voltage signal terminal, and transmit the identification signal to the interface circuit.

18. A driving method of a display substrate, wherein each display frame of the display substrate includes a data signal setting phase and a display phase, a data signal includes a current signal and pulse width modulation signals; the display substrate includes a plurality of pixel units and a control chip, and each pixel unit in the plurality of pixel units includes N light-emitting devices;
the driving method comprises:
in the data signal setting phase:
receiving, by the control chip, an image signal of an i-th frame, wherein the image signal of the i-th frame includes an initial current signal and an initial pulse width modulation signal that are corresponding to the N light-emitting devices of each pixel unit in the plurality of pixel units in a current frame of image; the initial current signal includes N initial current sub-signals, and the initial pulse width modulation signal includes N initial pulse width modulation sub-signals with a same number of bits;
processing, by the control chip, the initial current signal to generate the current signal, the current signal including an initial current sub-signal with a largest current amplitude in the N initial current sub-signals; and—
processing, by the control chip, the initial pulse width modulation signal to generate the pulse width modulation signals, the pulse width modulation signals including N pulse width modulation sub-signals with different number of effective bits, wherein
i is a positive integer greater than or equal to 1, and N is a positive integer greater than 1; and
in the display phase: emitting light by the N light-emitting devices of each pixel unit in the plurality of pixel units according to the current signal and the pulse width modulation signals.

19. The driving method of the display substrate according to claim 18, wherein the display phase includes: an address assignment phase and a light-emitting phase, and the display substrate further includes a plurality of control signal lines and a plurality of data signal lines;
in the address assignment phase, control information is sequentially input to each control signal line, and first data information is input to each data signal line, wherein the first data information includes address information corresponding to pixel units arranged in a second direction;
in the light-emitting phase, second data information is input to each data signal line, wherein the second data information includes a plurality of pieces of data sub-information; a piece of data sub-information in the plurality of pieces of data sub-information includes: address information corresponding to each pixel unit, and the current signal and the pulse width modulation signals that are corresponding to the address information and corresponding to a pixel driving chip of a pixel unit coupled to the data signal line.

20. The driving method of the display substrate according to claim 18, wherein the display substrate further includes a plurality of control signal lines and a plurality of data signal lines, and the display phase includes:
inputting control information to an m-th control signal line; and—
inputting data information to each data signal line, the data information including the current signal and the pulse width modulation signals that are corresponding to a pixel driving chip of a pixel unit coupled to the data signal line, wherein
m is any positive integer from 1 to M, inclusive, and M is a number of all control signal lines arranged in the second direction; the control chip sequentially inputs control information to a first control signal line to an M-th control signal line.

\* \* \* \* \*